(12) United States Patent
Schweizer et al.

(10) Patent No.: US 11,698,421 B2
(45) Date of Patent: *Jul. 11, 2023

(54) OFF-AXIS MAGNETIC ANGULAR SENSOR USING A MAGNETIC SENSING PROBE AND MULTI-POLE MAGNET ARRAY

(71) Applicant: Honeywell International Inc., Charlotte, NC (US)

(72) Inventors: Pascal Schweizer, Charlotte, NC (US); Christopher Kenney, Charlotte, NC (US); Richard Andrews, Charlotte, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/733,255

(22) Filed: Apr. 29, 2022

(65) Prior Publication Data

US 2022/0260653 A1 Aug. 18, 2022

Related U.S. Application Data

(63) Continuation of application No. 16/640,885, filed as application No. PCT/US2018/022423 on Mar. 14, 2018.

(51) Int. Cl.
*G01R 33/07* (2006.01)
*G01R 33/00* (2006.01)
*G01D 5/14* (2006.01)

(52) U.S. Cl.
CPC .......... *G01R 33/072* (2013.01); *G01D 5/145* (2013.01); *G01R 33/0094* (2013.01)

(58) Field of Classification Search
CPC ... G01R 33/072; G01R 33/0094; G01D 5/145
See application file for complete search history.

(56) References Cited

U.S. PATENT DOCUMENTS

| 6,448,760 B1 | 9/2002 | Neumann et al. |
| 7,489,127 B2 * | 2/2009 | Bauer ................ G01D 5/145 |
| | | 324/207.25 |
| 7,538,545 B2 | 5/2009 | Koike et al. |

(Continued)

OTHER PUBLICATIONS

CN Notice of Allowance dated Jul. 5, 2022 for CN Application No. 201880055687, 4 pages.

(Continued)

*Primary Examiner* — Reena Aurora
(74) *Attorney, Agent, or Firm* — Alston & Bird LLP

(57) ABSTRACT

Apparatus and associated methods relate to measuring position and displacement of a 2D surface magnet array of at least three adjacent magnetic north and south tracks with an acute angle versus its motion displacement relative to a magnetic field sensor (e.g., magnetic sensing probe). In an illustrative example, the geometry of the 2D surface magnet array may be planar with adjacent and alternating north and south pole regions. In some embodiments, the 2D surface magnet array geometry may take the form of (1) an axial cylindrical helical multipole magnet array having individually magnetized layers that are oriented in helical shape, or (2) a radial disk spiral multipole magnet array with at least three adjacent north and south tracks oriented as a spiral shape.

18 Claims, 18 Drawing Sheets

(56) References Cited

U.S. PATENT DOCUMENTS

| | | | |
|---|---|---|---|
| 8,552,715 | B2 | 10/2013 | Semineth et al. |
| 11,448,526 | B2* | 9/2022 | Ishigami ............... G01R 15/202 |
| 2005/0194969 | A1 | 9/2005 | Koike et al. |
| 2010/0244815 | A1 | 9/2010 | Burkhardt et al. |
| 2015/0247903 | A1 | 9/2015 | Maurio et al. |
| 2016/0148731 | A1 | 5/2016 | Ausserlechner |
| 2017/0003182 | A1 | 1/2017 | Schweizer et al. |
| 2018/0372511 | A1 | 12/2018 | Shulver et al. |
| 2019/0170497 | A1* | 6/2019 | Ausserlechner ......... G01B 7/30 |
| 2020/0408856 | A1 | 12/2020 | Schweizer et al. |

OTHER PUBLICATIONS

CN Office Action dated Apr. 21, 2021 for CN Application No. 201880055687, 7 pages.

CN Office Action dated Dec. 27, 2021 for CN Application No. 201880055687, 5 pages.

CN Search report dated Dec. 10, 2021 for CN Application No. 201880055687, 1 page.

Communication about intention to grant a European patent received for European Application No. 18715377.0, dated Sep. 8, 2022, 6 pages.

English translation of CN Notice of Allowance dated Jul. 5, 2022 for CN Application No. 201880055687, 2 pages.

English Translation of CN Office Action dated Apr. 21, 2021 for CN Application No. 201880055687.

English Translation of CN Office Action dated Dec. 27, 2021 for CN Application No. 201880055687, 7 pages.

Ex Parte Quayle Action received for U.S. Appl. No. 16/640,885, mailed on Mar. 22, 2022, 6 pages.

International Search Report of the International Searching Authority for PCT/US2018/022423 dated Dec. 6, 2018.

Non-Final Office Action received for U.S. Appl. No. 16/640,885, dated Sep. 9, 2021, 17 pages.

Notice of Allowance received for U.S. Appl. No. 16/640,885, dated Aug. 8, 2022, 2 pages.

Notice of Allowance received for U.S. Appl. No. 16/640,885, dated Jan. 10, 2022, 5 pages.

Notice of Allowance received for U.S. Appl. No. 16/640,885, dated May 10, 2022, 5 pages.

Outgoing Written Opinion of the ISA dated Dec. 6, 2018 for WO Application No. PCT/US18/022423.

Decision to grant a European patent dated Jan. 26, 2023 for EP Application No. 18715377.

Extended European Search Report dated May 12, 2023 for EP Application No. 23150765, 8 page(s).

* cited by examiner

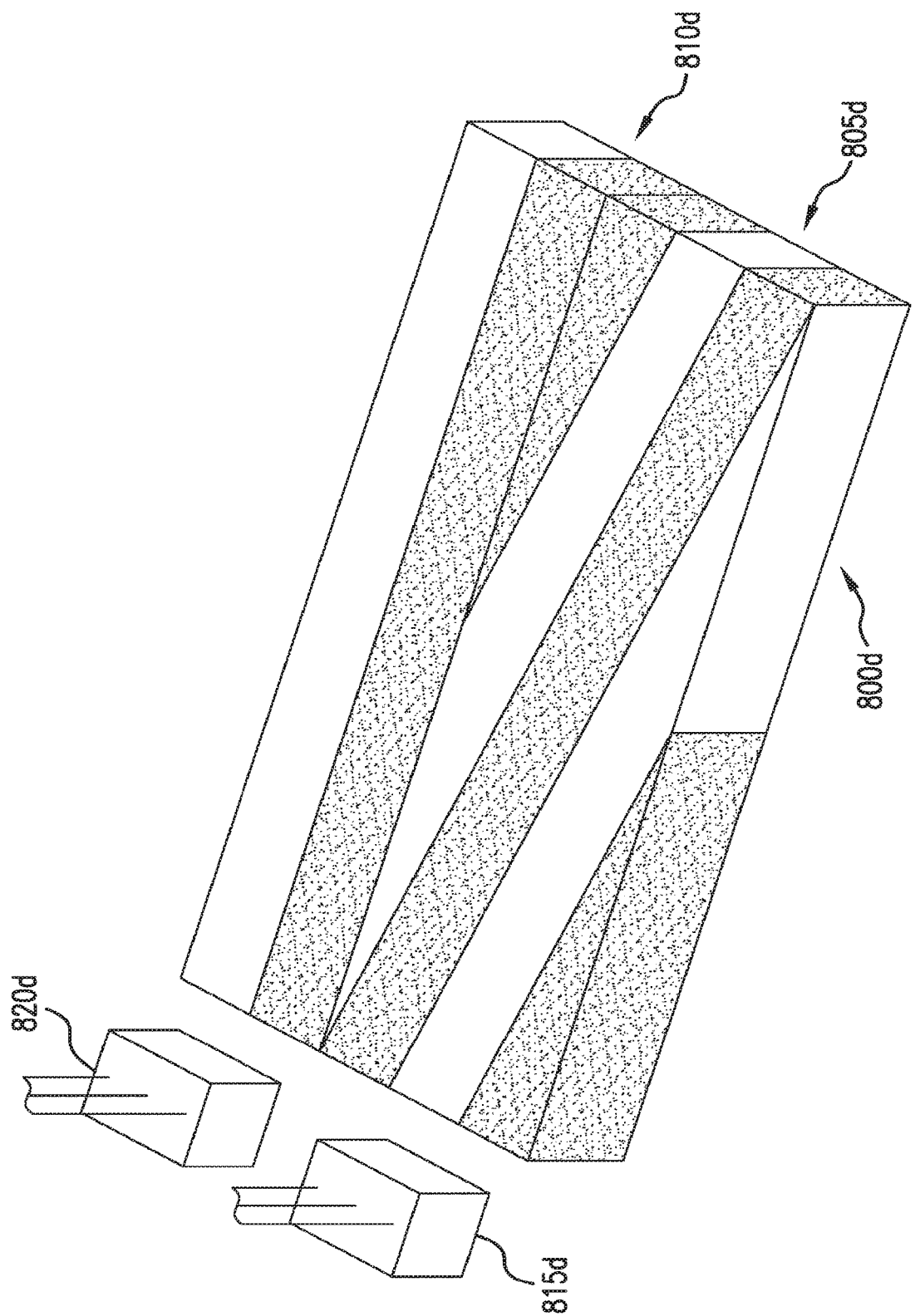

OFF-AXIS MAGNETIC ANGULAR SENSOR USING A MAGNETIC SENSING PROBE AND MULTI-POLE MAGNET ARRAY

CROSS REFERENCE TO RELATED APPLICATIONS

This application is a continuation of U.S. application Ser. No. 16/640,885, filed Feb. 21, 2020, which application is a U.S. National Phase Application of International Application No. PCT/US2018/022423, filed Mar. 14, 2018, which applications are incorporated herein by reference in their entirety.

TECHNICAL FIELD

Various embodiments relate generally to motion detection using magnetic field sensors.

BACKGROUND

Control of a multipole electrical motor may depend on sine and cosine signals with 90 degrees phase shift, with one sine and cosine period per electrical period. These sine and cosine signals may be generated by a resolver mounted on a rotating shaft of the electrical motor. A resolver is a type of rotary electrical transformer used for measuring degrees of rotation. Resolvers may be an analog sensing element used in control systems that control motor angular position in rotation and/or velocity. Resolvers may be used in measuring the rotation angular position of mechanical and electrical components in a wide array of applications, including computer numerical control (CNC) machines, robotics, and paper manufacturing machines as well as thermal or electrical motors in transportation vehicles.

Rotary encoders are electro-mechanical devices that convert the angular position or motion of a shaft or axle to an analog or digital signal. Rotary encoders may be used in applications that require precise shaft monitoring, sometimes with unlimited rotation, such as industrial controls, robotics, and rotating radar platforms. Rotary encoders may be absolute or incremental encoders.

A magnetic field sensor is an electronic component that measures a magnetic field. Magnetic field sensors may be used for proximity switching, positioning, speed detection, and current sensing applications. Magnetic field sensors may be used to time the speed of wheels and shafts, such as for internal combustion engine ignition timing, tachometers, and anti-lock braking systems. Types of magnetic field sensors may include Hall effect sensors, AMR/GMR magnetometers, magneto-resistive sensors, and TMR sensors.

SUMMARY

Apparatus and associated methods relate to measuring position and displacement of a 2D surface magnet array of at least three adjacent magnetic north and south tracks with an acute angle versus its motion displacement relative to a magnetic field sensor (e.g., magnetic sensing probe). In an illustrative example, the geometry of the 2D surface magnet array may be planar with adjacent and alternating north and south pole regions. In some embodiments, the 2D surface magnet array geometry may take the form of (1) an axial cylindrical helical multipole magnet array having individually magnetized layers that are oriented in helical shape, or (2) a radial disk spiral multipole magnet array with at least three adjacent north and south tracks oriented as a spiral shape.

Various embodiments may achieve one or more advantages. For example, some embodiments may be adapted for use in a wide variety of mechanical, electronic, industrial, and commercial applications. In some examples, the magnet array and magnetic field sensor may be a cheaper, smaller, and more lightweight alternative to (and replacement for) resolvers. For example, some embodiments may increase control motor compactness and reduce motor weight. Some embodiments may include a sensor that is a backwards compatible solution for a resolver and may provide the same type of output as a resolver, but based on a low-cost, highly integrated magnetic field sensor design and associated tilted angle multipole magnetic ring rotating target.

In various embodiments, the magnet array and magnetic field sensor may provide for a compensation mechanism to measure and remove any misalignment errors linked to mechanical stack tolerance or aging. In various examples, the magnet array may be customized to match the electrical phase period of electrical motors, allowing for the magnet array and magnetic field sensor to be used instead of a wide variety of old, broken, or obsolete rotation measuring devices.

An advantage of some embodiments may be a magnetic field angular sensor configured to generate analog sine and cosine outputs with 90 degrees phase shift from two magnetic probes (such as an MR bridge) that sense the displacement of a multipole ring magnet array with magnetic pole width w, and tilted with a specific angle $\theta$ in order to generate N sine and cosine periods per 360 degrees rotation. A magnet array with a specific tilt angle may advantageously allow for customized periodic output of the magnetic field sensor to control an electrical motor (e.g., motor rotational velocity) having N poles. Such a solution may result in a sensor output with a specific period that matches the output of a resolver.

The details of various embodiments are set forth in the accompanying drawings and the description below. Other features and advantages will be apparent from the description and drawings, and from the claims.

BRIEF DESCRIPTION OF THE DRAWINGS

FIG. 8D depicts a perspective view of an exemplary planar multipole magnet array (similar to FIG. 5) along with an exemplary magnetic field sensor, the planar multipole magnet array also having adjacent straight, and angled magnetic track sections.

Like reference symbols in the various drawings indicate like elements.

DETAILED DESCRIPTION OF ILLUSTRATIVE EMBODIMENTS

Figure 1:
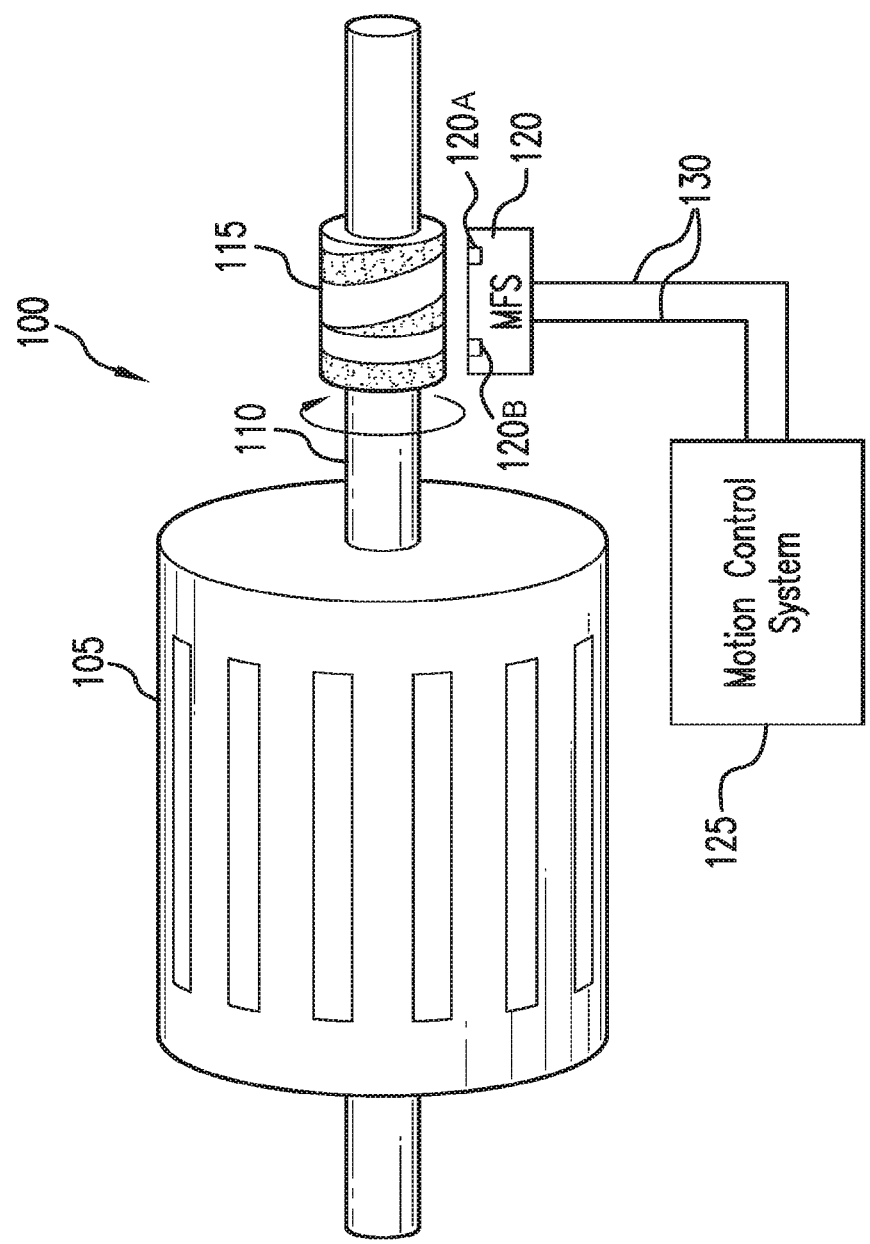
FIG. 1 depicts a perspective view of an exemplary brushless DC electric motor having an exemplary rotation measuring system.

FIG. 1 depicts a perspective view of an exemplary brushless DC electric motor having an exemplary rotation measuring system. An exemplary brushless DC electric motor 100 is shown having a rotor core 105. The rotor core 105 rotates in response to a changing magnetic field applied by a stator (not shown). When the rotor core 105 rotates, a shaft 110 rotates with it. Fixed to the shaft 110 is an (axial) cylindrical magnet 115 that rotates at the same speed of rotation as the shaft 110. The cylindrical magnet 115 has different regions of magnetic polarity, such that when the cylindrical magnet 115 rotates, it produces a changing magnetic field. This changing magnetic field is measured by an at least one magnetic field sensor 120 (e.g., magnetic sensing probe). The at least one magnetic field sensor 120 is coupled to a motion control system 125 via electrical connections 130. The magnetic field sensor may include, for example, at least one magnetic sensing probe 120A to measure the angular position and displacement, and at least one magnetic sensing probe 120B to measure the axial position variation due to the axial stack tolerance and compensate the error that it introduces. The instantaneous magnetic field at the at least one magnetic field sensor 120 is converted into an electrical signal that the at least one magnetic field sensor 120 communicates to the motion control system 125 via the electrical connections 130. The motion control system 125 includes circuitry that is configured to control the rotation of the rotor core 105 based on the received electrical signals from the at least one magnetic field sensor 120.

The motion control system 125 may include a programmable logic controller (PLC) having specific circuit logic designed to control the rotation of the rotor core 105. In some examples, the motion control system 125 may be coupled to a stator (not shown) coupled to the rotor 105. In such examples, the motion control system 125 may control the energizing and de-energizing of electromagnets in the stator. The electrical signals received by the motion control system 125 from the at least one magnetic field sensor 120 may allow the motion control system 125 to accurately time the energizing and de-energizing of the electromagnets in the stator to achieve a smooth rotation of the rotor core 105 and the shaft 110.

Figure 2:
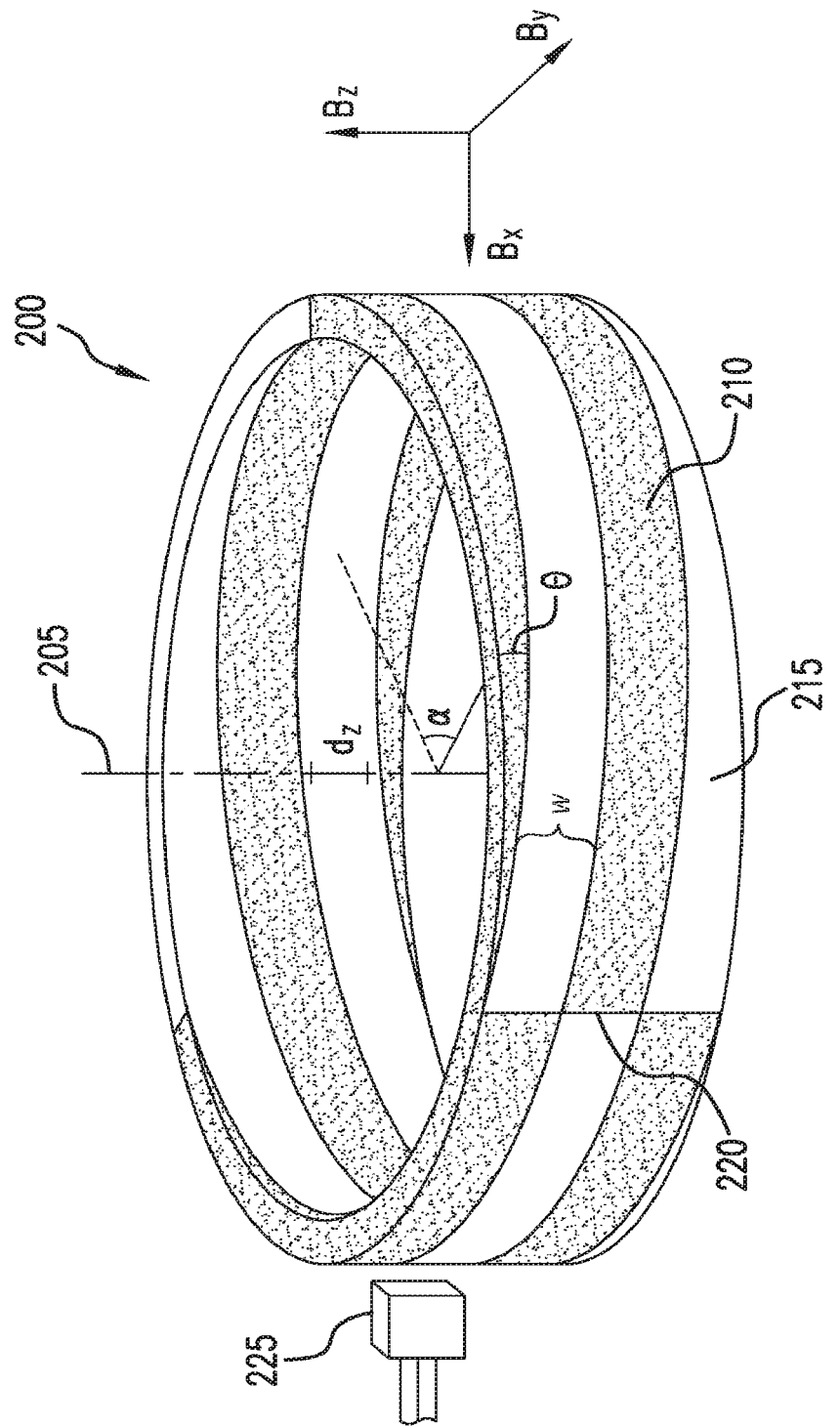
FIG. 2 depicts a perspective view of an exemplary axial cylindrical helical multipole magnet array with three adjacent tilted tracks, along with an exemplary magnetic field sensor.

FIG. 2 depicts a perspective view of an exemplary axial cylindrical helical multipole magnet array with three adjacent tilted tracks, along with an exemplary magnetic field sensor. An axial cylindrical helical multipole magnet array 200 is shown having a center axis 205. The axial cylindrical helical multipole magnet array 200 may rotate around the center axis 205 when, for example, the axial cylindrical helical multipole magnet array 200 is attached to a rotating shaft (e.g., shaft 110, FIG. 1). The cylindrical helical multipole magnet array 200 includes three adjacent magnetized layers. These magnetized layers include a north magnetized layer 210 and a south magnetized layer 215 that are adjacent to one another and have a fixed width w. The magnetized layers 210 and 215 coil within the cylindrical helical multipole magnet array 200 in a helical fashion with a constant tilted angle. The magnetized layers 210 and 215 wind around the center axis 205, such that the magnetized layers are monotonically disposed (e.g., located or distributed in a circular helix/helicoid configuration having a constant magnitude slope) about the center axis 705 as a function of the radial angle α about the center axis 205, as well as the distance $d_z$ along the center axis 205. Put another way, the width-wise mid-point of each magnetic layer is distributed monotonically as a function of the radial angle α (e.g., moving from 0° to 360°) about the center axis 205, as well as the distance $d_z$ along the center axis 205. At magnetic discontinuity 220, the layers switch polarity, but continue to coil within the cylindrical helical multipole magnet array 200.

Located on the outer perimeter of the axial cylindrical helical multipole magnet array 200 is a magnetic field sensor 225. The magnetic field sensor 225 is configured to output an electrical signal that is a function of the local magnetic field around the magnetic field sensor 225. As the cylindrical helical multipole magnet array 200 rotates around the center axis 205, the intensity of the magnetic field (e.g., $B_x$ and $B_y$) around the magnetic field sensor varies due to the helical nature of the magnetized layers 210 and 215. The exact output signal of the magnetic field sensor 225 as a function of the rotation of the cylindrical helical multipole magnet array 200 will be described in further detail in subsequent paragraphs.

In some examples, the magnetic discontinuity 220 may be absent from the cylindrical helical multipole magnet array 200. In various embodiments, the helical windings in the cylindrical helical multipole magnet array 200 may have greater or lesser pitch than the illustrative embodiment shown in FIG. 2. The pitch of the cylindrical helical multipole magnet array 200 may be customized to determine the exact period of sine/cosine signals output by the magnetic field sensor 225 when the cylindrical helical multipole magnet array 200 rotates at a constant angular velocity.

Figure 3:
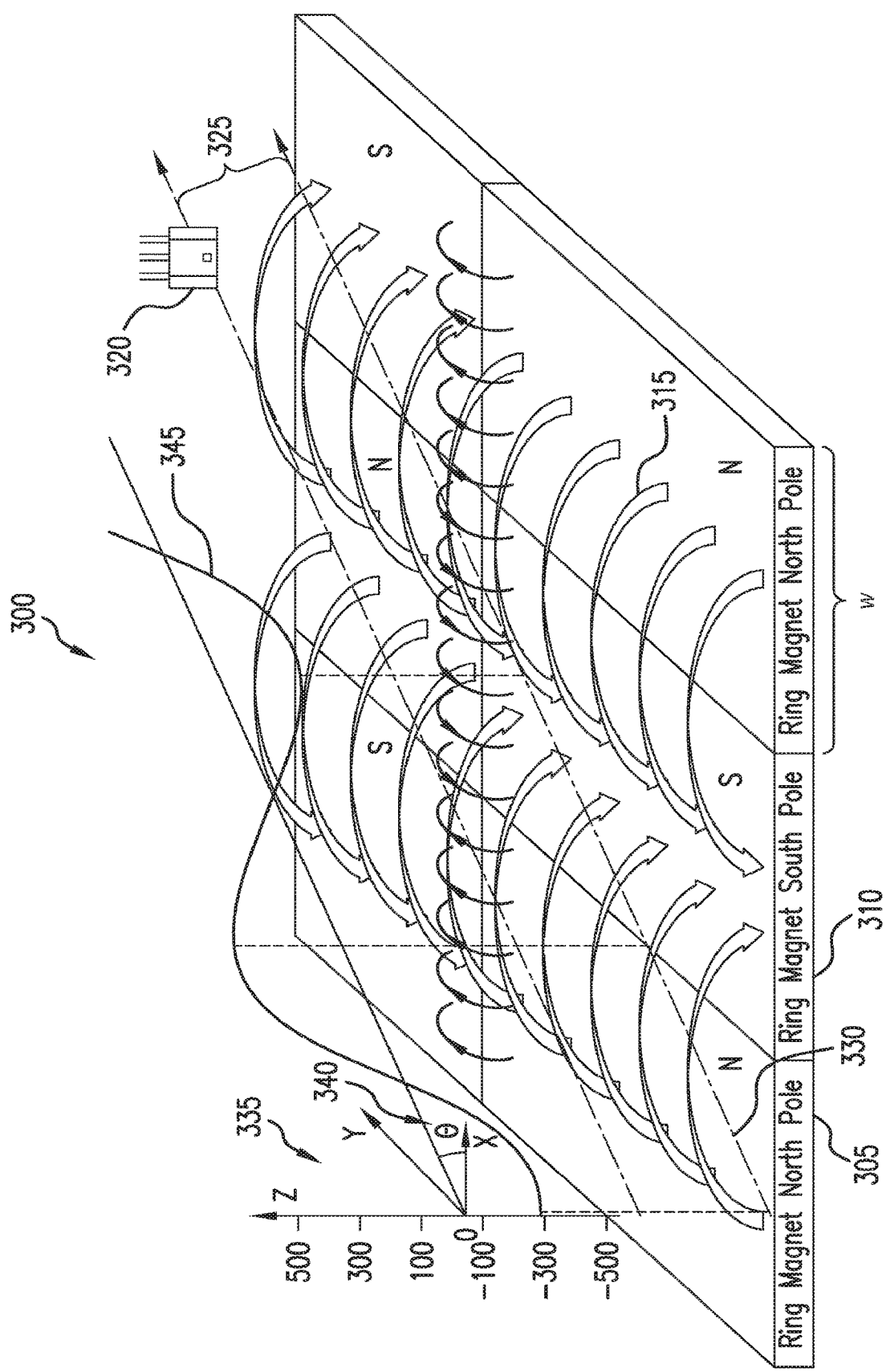
FIG. 3 depicts a perspective view of an exemplary 2D surface multipole magnet track having alternating north and south poles having the same width w.

FIG. 3 depicts a perspective view of an exemplary 2D surface multipole magnet track having alternating north and south poles having the same width w. A multipole magnet track 300 is planar in shape and includes north poles 305 and south poles 310 that are adjacent to one another. The alternating north and south poles 305 and 310 produce magnetic field lines 315 that originate from the north poles 305 and terminate at the south poles 310. Near the center of each pole 305 and 310, the magnetic field lines 315 are substantially orthogonal to the plane defined by the multipole magnet track 300. For example, near the center of the north poles 305, the magnetic field lines 315 point upward and normal to the plane of the multipole magnet track 300. Near the center of the south poles 310, the magnetic field lines point downward and normal to the plane of the multipole magnet track 300.

A magnetic field sensor 320 is located above the multipole magnet track 300. The distance between the magnetic field sensor 320 and the multipole magnet track 300 defines an airgap 325. The magnetic field sensor 320 travels a path 330 relative to the multipole magnet track 300. A coordinate axis 335 is defined with respect to the multipole magnet track 300, with an x-axis defined by movement right and left relative to the multipole magnet track 300, a y-axis defined by movement forward and backward relative to the multipole magnet track 300, and a z-axis defined by movement up and down relative to the multipole magnet track 300. The path 330 of the magnetic field sensor 320 does not vary along the z-axis, but it does move along the x and y axes. More specifically, the path 330 of the magnetic field sensor is a substantially straight line that lies in a plane defined by the x and y axes for a constant z value above the multipole magnet track 300. The line of the path 330 makes and angle θ 340 with respect to the x-axis. Relative constant movement of the magnetic field sensor 320 with respect to the multipole magnet track 300 along the path 330 results in a sinusoidal signal 345 output by the magnetic field sensor 320. The period $P_\theta$ of the sinusoidal signal 345 is dependent in part upon the period p of the pattern of the north and south poles 305 and 310 that is linked to the width w of the north and south poles 305 and 310, as well as the angle θ 340 the path 330 makes with respect to the x-axis:

$$P_\theta = \frac{w}{\cos\theta}$$

Although the details of the planar multipole magnet track 300 has been described, the same details may also apply to tracks on an axial cylindrical magnet (e.g., axial cylindrical helical multipole magnet array 200, FIG. 2). For example, the relative path of the magnetic field sensor 225 with respect to the rotating cylindrical helical multipole magnet array 200 may resemble the relative path 330 of the magnetic field sensor 320 with respect to the multipole magnet track 300. This is because the local topology of the outer surface of the cylindrical helical multipole magnet array 200 resembles the topology of the planar multipole magnet track 300. In such a case, the angle of travel of the magnetic field sensor 225 relative to adjacent north and south pole layers 210 and 215 of the rotating cylindrical helical multipole magnet array 200 may be determined by the pitch of the helix. A helix with a small pitch may correspond to a small angle θ 340, while a helix with a greater pitch may correspond to a greater angle θ 340. Similarly, the same details of the planar multipole magnet track 300 may apply to a radial spiral disk multipole magnet array shown in FIG. 7 (described in depth below).

In some examples, when the magnetic pole pattern shown in FIG. 3 is created (for example, with 3 periods per 360 degrees revolution of the ring magnet), the magnetic fields can be projected into the x-z plane and into the y-z plane. When the magnetic field sensor is located in the x-z plane, the magnetic field sensors may only be sensitive to the magnetic field projected into the x-z plane. As such, the sine shape of the signal output from the magnetic field sensor may retain its shape when the magnetic field sensor moves from a north to a south pole (as the magnetic field sensor may not be sensitive to the direction of the magnetic field, and may not sensitive to the magnetic field located into the y-z plane).

Figure 4A:
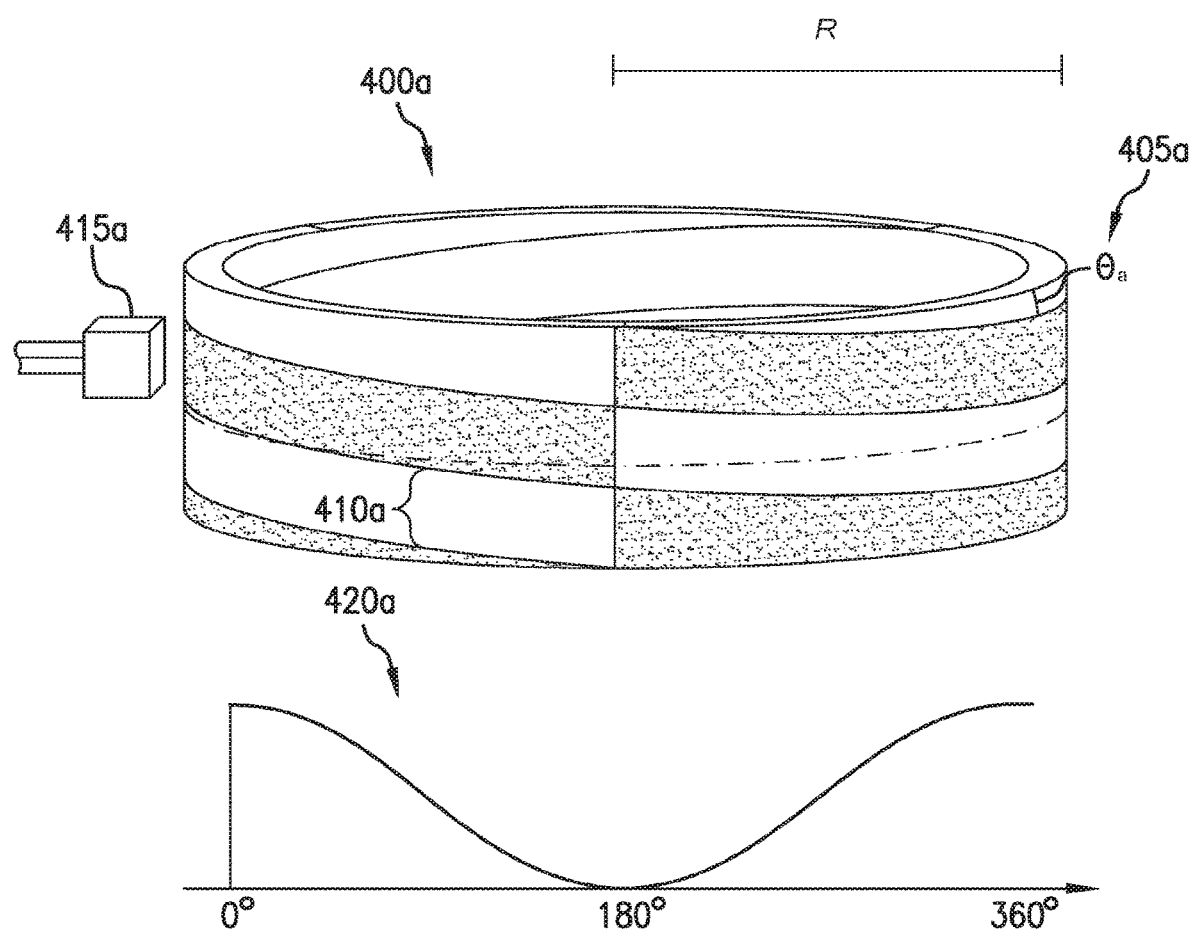
FIGS. 4A, 4B, and 4C depict perspective views of exemplary axial cylindrical helical multipole magnet arrays having varying degrees of pitch along with an exemplary magnetic field sensor.
Figure 4B:
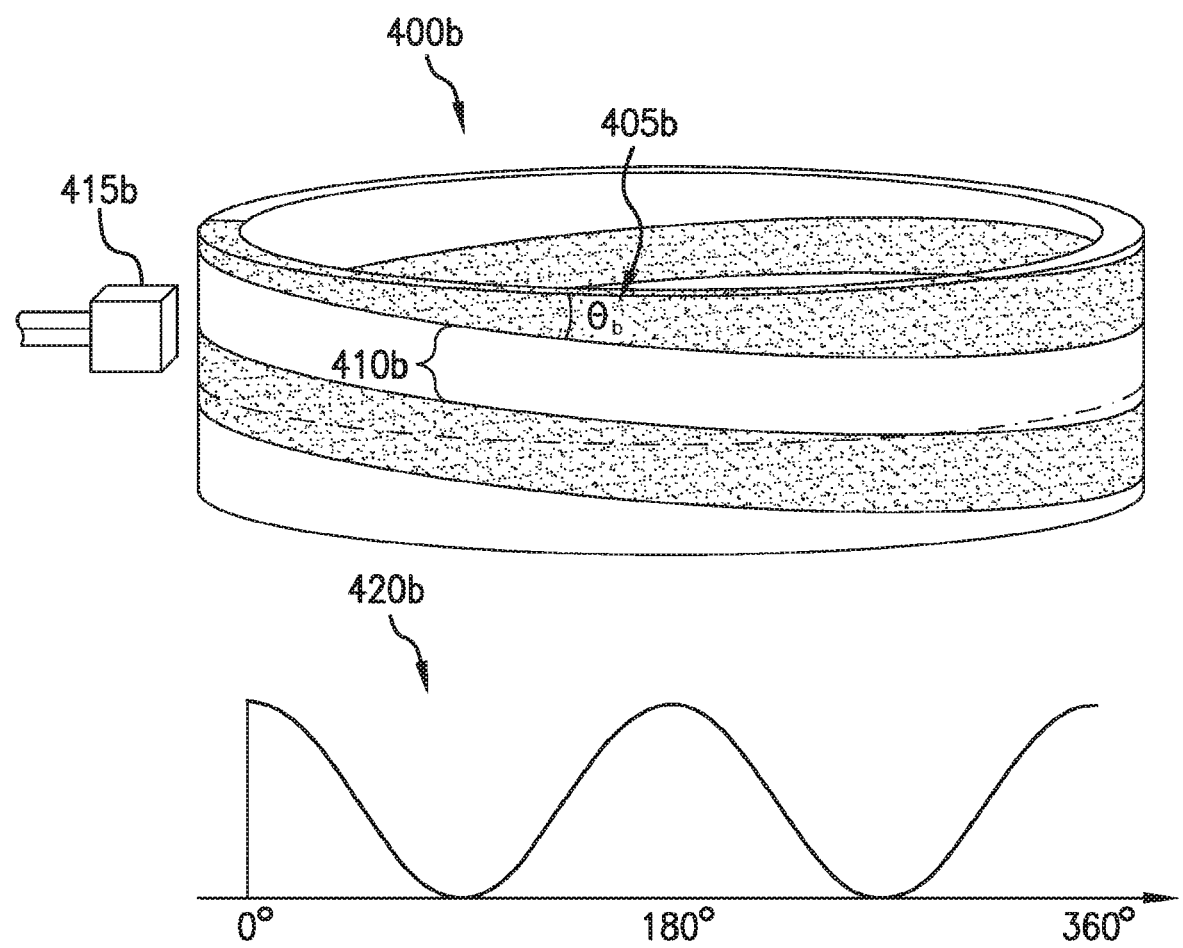
Figure 4C:
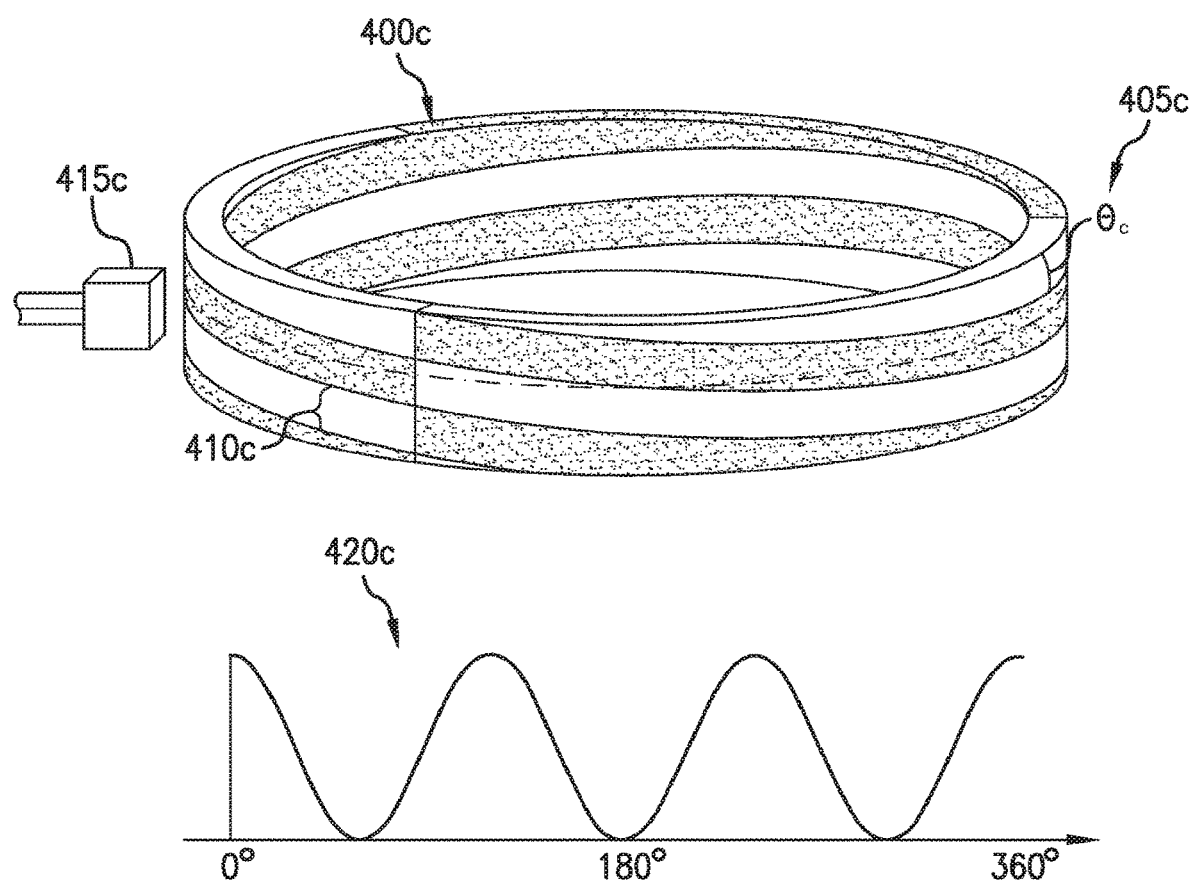

FIGS. 4A, 4B, and 4C depict perspective views of exemplary axial cylindrical helical multipole magnet arrays having varying degrees of pitch. As shown in FIG. 4A, a first axial cylindrical helical multipole magnet array 400a having a radius R that has a helix pitch angle $\theta_a$ 405a (between 0 and 90 degrees) and three adjacent poles with a constant pole width w 410a. Located near the outer surface of the first cylindrical helical multipole magnet array 400a is a magnetic field sensor 415a. As the first cylindrical helical multipole magnet array 400a rotates at a constant angular velocity about its center axis, the changing magnetic field around the magnetic field sensor 415a is translated into a sinusoidal electrical signal 420a. In this example, the helix pitch angle $\theta_a$ 405a is adjusted to create one period P of the sinusoidal electrical signal 420a per revolution of 360 degree of the first cylindrical helical multipole magnet array 400a. The angle $\theta_a$ that will generate one period P is given by the equation:

$$\tan(\theta_a) = \frac{w}{2\pi R}$$

As shown in FIG. 4B, a second axial cylindrical helical multipole magnet array 400b has a helix pitch angle $\theta_b$ 405b (between 0 and 90 degrees) and three adjacent poles with a constant pole width w 410b. The helix pitch angle $\theta_b$ 405b is greater than the helix pitch angle $\theta_a$ 405a. Located near the outer surface of the second cylindrical helical multipole magnet array 400b having a radius R that is a magnetic field sensor 415b. As the second cylindrical helical multipole magnet array 400b rotates at a constant angular velocity about its center axis, the changing magnetic field around the magnetic field sensor 415b is translated into a sinusoidal electrical signal 420b. In this example, the helix pitch angle $\theta_b$ 405b is adjusted to create two periods P of the sinusoidal electrical signal 420b per revolution of 360 degree of the second cylindrical helical multipole magnet array 400b. The angle $\theta_b$ that will generate two period P is given by the equation:

$$\tan(\theta_b) = \frac{2w}{2\pi R}$$

As shown in FIG. 4C, a third axial cylindrical helical multipole magnet array 400c has a helix pitch angle $\theta_c$ 405c (between 0 and 90 degrees) and three adjacent poles with a constant pole width w 410c. The helix pitch angle $\theta_c$ 405c is greater than the helix pitch angle $\theta_b$ 405b. Located near the outer surface of the third cylindrical helical multipole magnet array 400c having a radius R that is a magnetic field sensor 415c. As the third cylindrical helical multipole magnet array 400c rotates at a constant angular velocity about its center axis, the changing magnetic field around the magnetic field sensor 415c is translated into a sinusoidal electrical signal 420c. In this example, the helix pitch angle $\theta_c$ 405c is adjusted to create three periods P of the sinusoidal electrical signal 420c per revolution of 360 degree of the third cylindrical helical multipole magnet array 400c. The angle $\theta_c$ that will generate three period P is given by the equation:

$$\tan(\theta_c) = \frac{3w}{2\pi R}$$

More generally, in various embodiments the pitch or tilt angle of the cylindrical multipole magnet array may be specifically adjusted to create N periods per revolution of the cylindrical multipole magnet array. The adjusted helix pitch angle $\theta_N$ is to create N periods P of the sinusoidal electrical signal per revolution of 360 degree of the cylindrical helical multipole magnet array having three adjacent poles with a constant pole width w. The angle $\theta_N$ that will generate N periods P is given by the equation:

$$\tan(\theta_N) = \frac{Nw}{2\pi R}$$

This may allow for replacement of resolvers for control of N poles electrical motors. Furthermore, the pitch or tilt angle can be adjusted to create N periods per revolution of a ring magnet to obtain a true power on off axis angular sensor (or a linear sensor) with absolute position measurement within each of these N periods.

In some examples, the dashed lines around the cylindrical helical multipole magnet arrays in FIG. 4A-4C may represent the relative displacement of the magnetic field sensor with respect to the cylindrical helical multipole magnet arrays. For example, as the cylindrical helical multipole magnet array rotates about its center axis, the magnetic field sensor may measure the magnetic field in the local vicinity of the dashed line. This magnetic field may vary in a sinusoidal fashion due to the non-zero pitch angle of the helical magnetic layers of the cylindrical helical multipole magnet array. This may result in the magnetic field sensor generating an output signal with a specific number of periods per rotation of the cylindrical helical multipole magnet array.

Figure 5A:
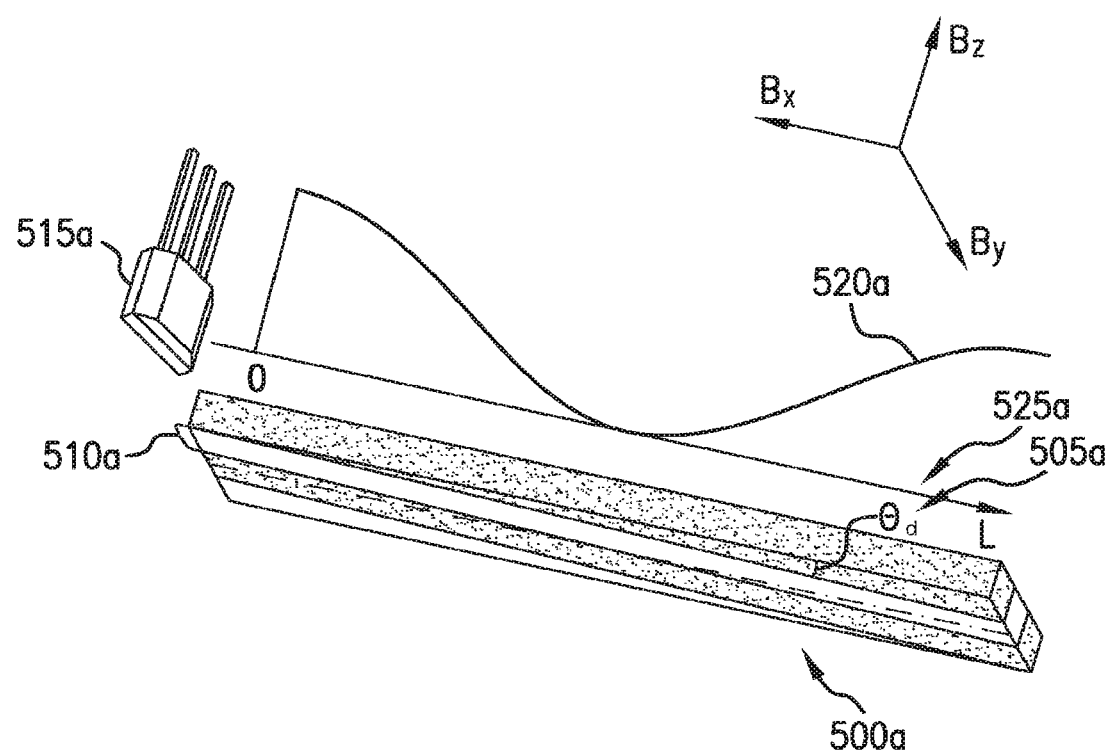
FIGS. 5A, 5B, and 5C depict perspective views of exemplary planar multipole magnet arrays of length L with three adjacent tilted magnetic tracks having varying degrees of pitch, along with an exemplary magnetic field sensor.
Figure 5B:
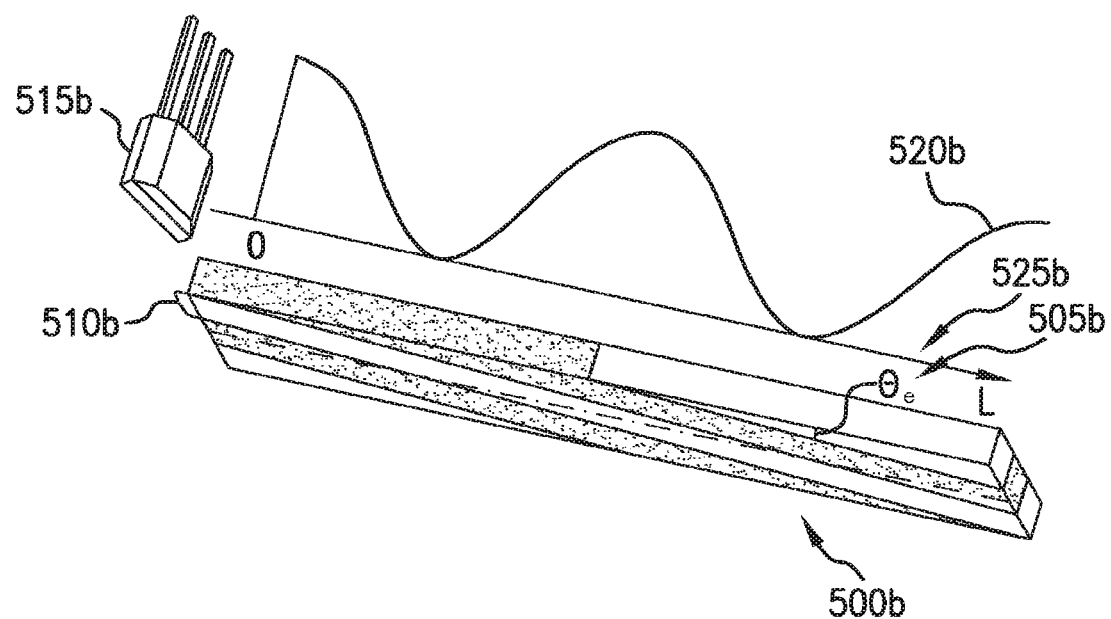
Figure 5C:
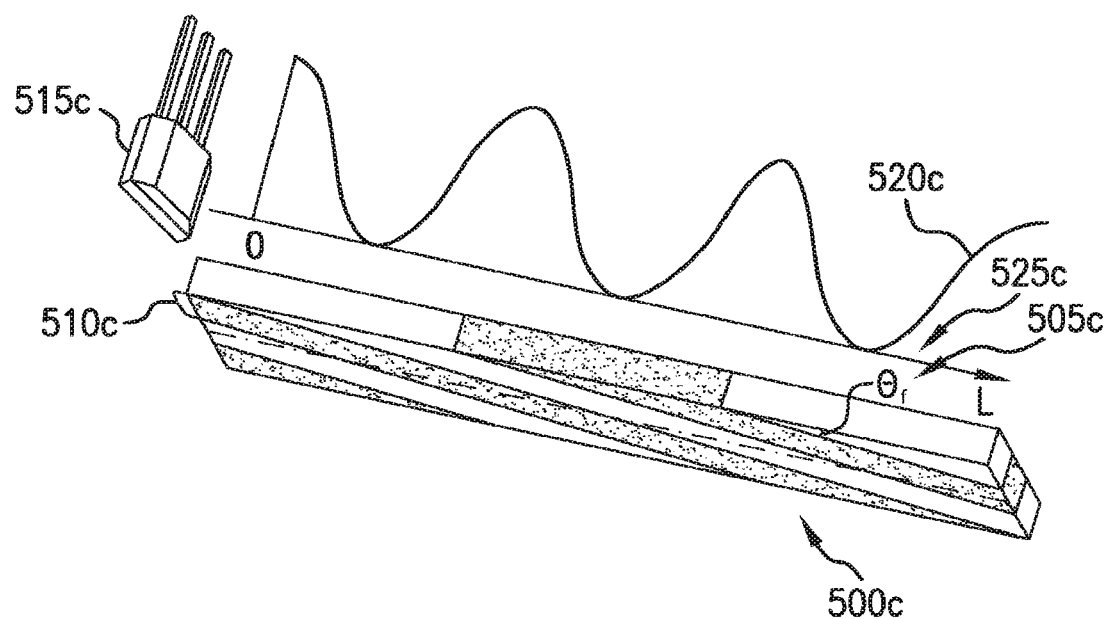

FIGS. 5A, 5B, and 5C depict perspective views of exemplary planar multipole magnet arrays of length L with three adjacent tilted magnetic tracks having varying degrees of pitch per unit length L, along with an exemplary magnetic field sensor. As shown in FIG. 5A, a first planar multipole magnet array 500a with three adjacent tilted magnetic tracks has a tilt angle $\theta_d$ 505a (between 0 and 90 degrees) and a pole width w 510a. Located near the top surface of the first planar multipole magnet array 500a is a magnetic field sensor 515a. As magnetic field sensor 515a moves at a constant velocity relative to the top surface of the first planar multipole magnet array 500a, the changing magnetic field around the magnetic field sensor 515a is translated into a sinusoidal electrical signal 520a. In this example, the tilt angle $\theta_d$ 505a is adjusted to create one period P of the sinusoidal electrical signal 520a per unit length L 525a of the first planar multipole magnet array 500a. The angle $\theta_d$ that will generate one period P is given by the equation:

$$\tan(\theta_d) = \frac{w}{L}$$

As shown in FIG. 5B, a second planar multipole magnet array 500b with three adjacent tilted magnetic tracks has a tilt angle $\theta_e$ 505b (between 0 and 90 degrees) and a pole width w 510b. The tilt angle $\theta_e$ 505b is greater than the tilt angle $\theta_d$ 505a. Located near the top surface of the second planar multipole magnet array 500b is a magnetic field sensor 515b. As magnetic field sensor 515b moves at a constant velocity relative to the top surface of the second planar multipole magnet array 500b, the changing magnetic field around the magnetic field sensor 515b is translated into a sinusoidal electrical signal 520b. In this example, the tilt angle $\theta_e$ 505b is adjusted to create two periods P of the sinusoidal electrical signal 520b per unit length L 525b of the second planar multipole magnet array 500b. The angle $\theta_e$ that will generate two periods P is given by the equation:

$$\tan(\theta_e) = \frac{2w}{L}$$

As shown in FIG. 5C, a third planar multipole magnet array 500c with three adjacent tilted magnetic tracks has a tilt angle $\theta_f$ 505c (between 0 and 90 degrees) and a pole width w 510c. The tilt angle $\theta_f$ 505c is greater than the tilt angle $\theta_e$ 505b. Located near the top surface of the third planar multipole magnet array 500c is a magnetic field sensor 515c. As magnetic field sensor 515c moves at a constant velocity relative to the top surface of the third planar multipole magnet array 500c, the changing magnetic field around the magnetic field sensor 515c is translated into a sinusoidal electrical signal 520c. In this example, the tilt angle $\theta_f$ 505c is adjusted to create three periods P of the sinusoidal electrical signal 520c per unit length L 525c of the third planar multipole magnet array 500c. The angle $\theta_f$ that will generate three periods P is given by the equation:

$$\tan(\theta_f) = \frac{3w}{L}$$

More generally, in various embodiments the pitch or tilt angle of the planar multipole magnet array of a length L may be specifically adjusted to create M periods unit length L of the 2D planar magnet array. The adjusted tilted pitch angle $\theta_M$ is to create M periods P of the sinusoidal electrical signal per unit length L of the planar multipole magnet array having three adjacent poles with a constant pole width w. The angle $\theta_M$ that will generate M periods P is given by the equation:

$$\tan(\theta_M) = \frac{Mw}{L}$$

Figure 6A:
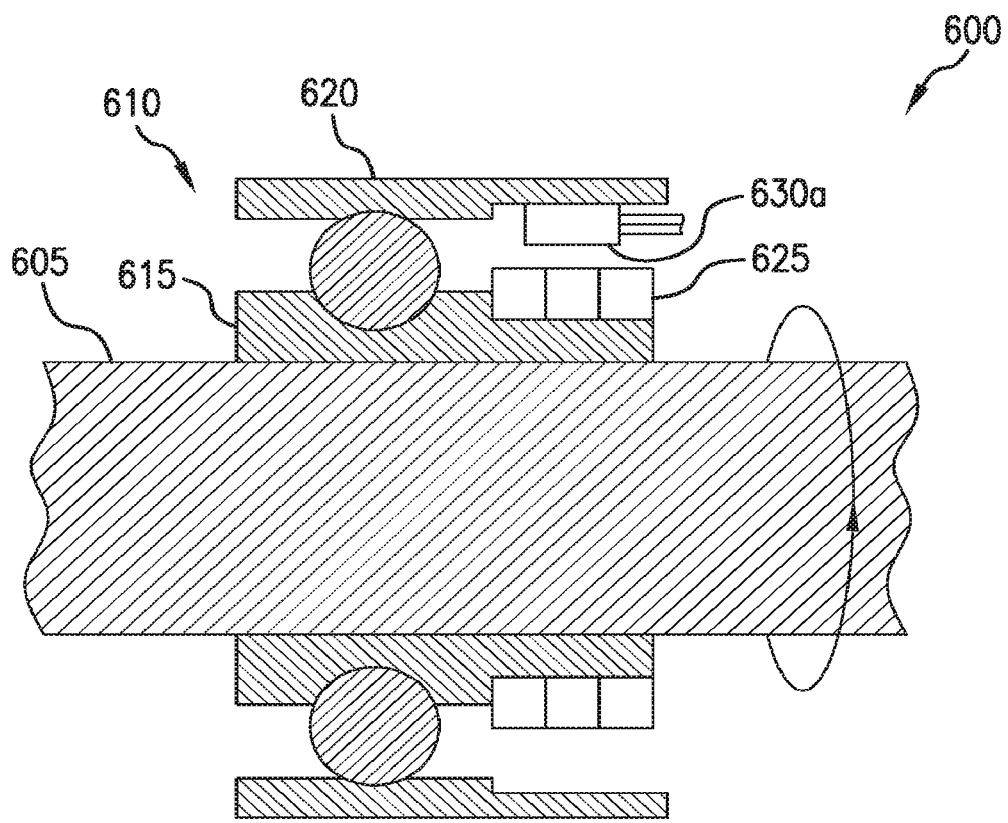
FIGS. 6A and 6B depict cross-sectional views of an exemplary motor shaft having radial bearings that retain, in FIG. 6A, an exemplary axial cylindrical multipole magnet array with three adjacent magnetic north and south tracks having a tilt angle, and, in FIG. 6B, a radial disk multipole magnet array with three adjacent magnetic north and south tracks having a tilt angle, along with an exemplary magnetic field sensor.
Figure 6B:
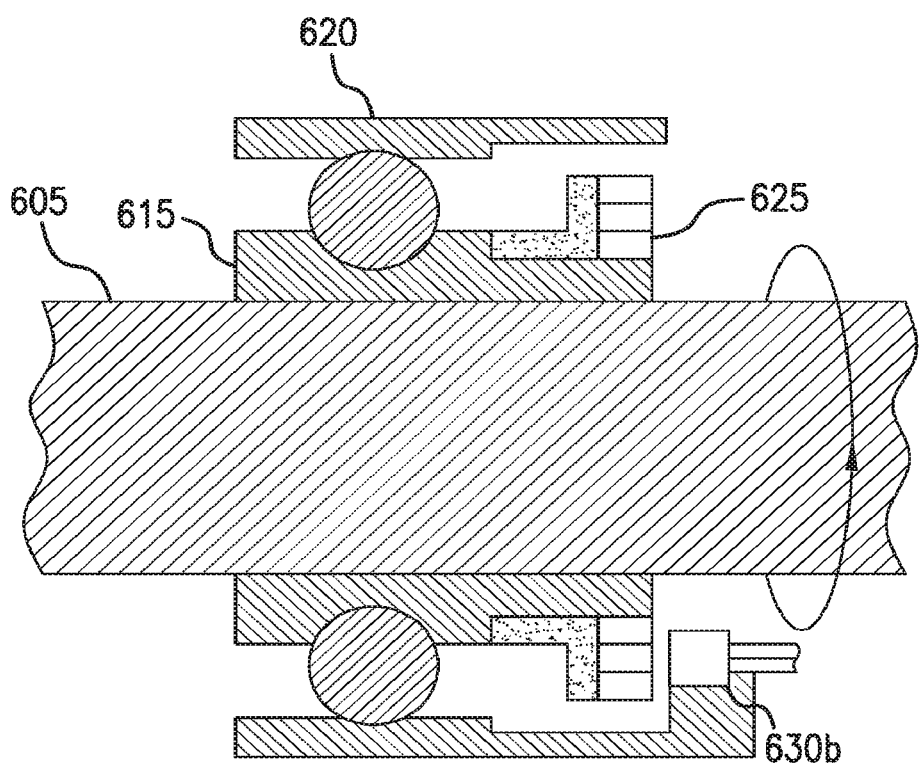

FIGS. 6A and 6B depict cross-sectional views of an exemplary motor shaft having radial bearings that retain, in FIG. 6A, an exemplary axial cylindrical multipole magnet array with three adjacent magnetic north and south tracks having a tilt angle, and, in FIG. 6B, a radial disk multipole magnet array with three adjacent magnetic north and south tracks having a tilt angle, along in both cases with an exemplary magnetic field sensor. A motor shaft component section 600 includes a motor shaft 605 and a bearing 610 coupled (e.g., press-fit) to the motor shaft 605. The bearing 610 includes an inner race 615 and an outer race 620. A cylindrical multipole magnet array 625a/625b is fixedly coupled (e.g., press-fit) to an outer surface of the inner race 615. When the shaft 605 rotates relative to the outer race 620, the inner race 615 and the cylindrical multipole magnet array 625a/625b rotate along with the shaft 605 (relative to the outer race 620). In case where the shaft is fixed and the outer race 620 rotates, then 630a and 630b may be permuted.

In the FIG. 6A exemplary embodiment, a magnetic field sensor 630a is fixedly coupled to an inner surface of the outer race 620 in a position proximate to an outer surface of the cylindrical helical (axial) multipole magnet array 625a that is fixedly coupled to the outer surface of the inner race 615 of the bearing 610. Relative rotation between the inner and outer races 615 and 620 results in a changing magnetic field at the magnetic field sensor 630a due to the relative rotation of the cylindrical helical multipole magnet array 625a. This changing magnetic field at the magnetic field sensor 630a is translated into an electrical signal which can be used to measure the rotational displacement, speed, and direction of the shaft 605 relative to the outer race 620.

Figure 7:
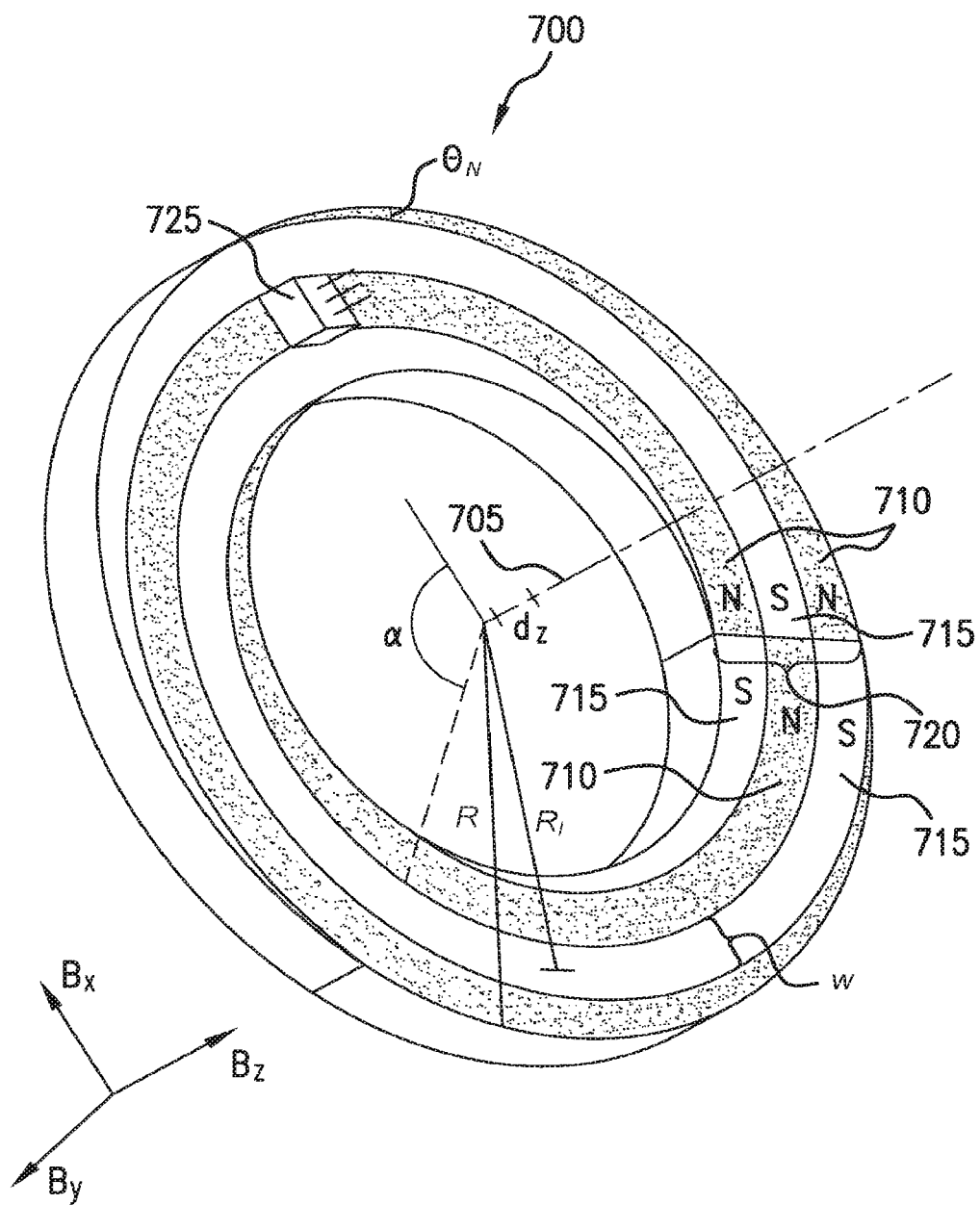
FIG. 7 depicts a perspective view of an exemplary radial disk multipole magnet array with three adjacent magnetic north and south tracks having a tilt angle, such that the adjacent magnetic north and south tracks are oriented as a spiral shape.
Figure 9:
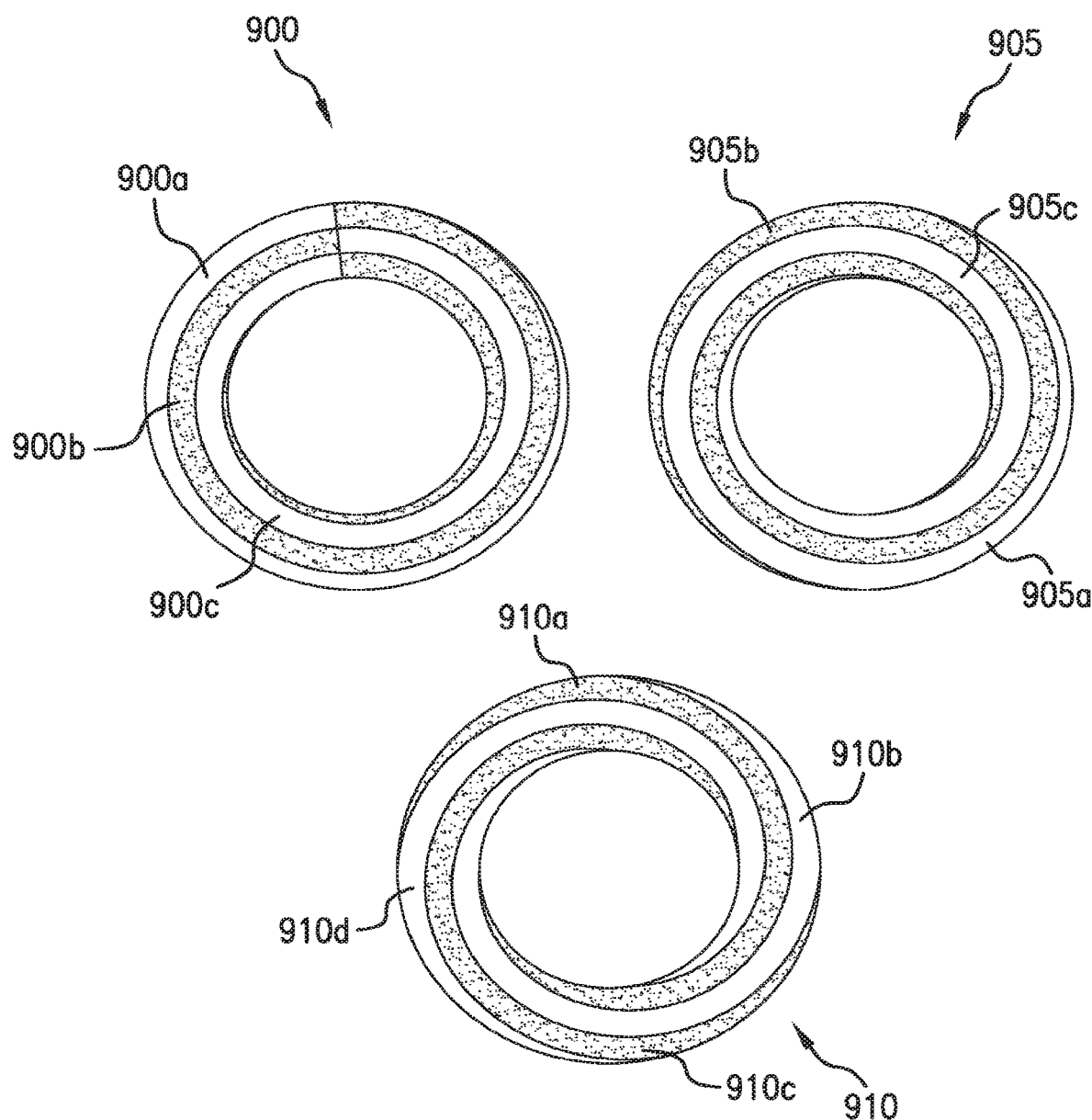
FIG. 9 depicts plan views of exemplary radial disk multipole magnet arrays (similar to FIG. 7) with three adjacent magnetic north and south tracks having a tilt angle, the adjacent magnetic north and south tracks being oriented as a spiral shape and having varying degrees of spiraling.

In the FIG. 6B exemplary embodiment, a magnetic field sensor 630b is fixedly coupled to the inner surface of the outer race 620 of the bearing 610 in a position proximate to a side surface of the disk spiral (radial) multipole magnet array 625b that is fixedly coupled to the outer surface of the inner race 615 of the bearing 610 (see, e.g., FIGS. 7 and 9). Relative rotation between the inner and outer races 615 and 620 results in a changing magnetic field at the magnetic field sensor 630b due to the relative rotation of the disk spiral multipole magnet array 625b. This changing magnetic field at the magnetic field sensor 630b is translated into an electrical signal which can be used to measure the rotational position, displacement, speed, and direction of the shaft 605 relative to the outer race 620.

In some examples, a multipole magnet array system may be embedded into a bearing that is directly mounted to a motor that may be an electrical motor. For example, the multipole magnet array may be attached to an inner or outer race of a bearing. Furthermore, the magnetic field sensor may also be attached to an inner or outer race of a bearing. The multipole magnet array and magnetic field sensor may be located on different bearings so that relative rotation between the bearings can be measured using the multipole magnet array system.

FIG. 7 depicts a perspective view of an exemplary radial disk multipole magnet array with adjacent magnetic north and south tracks having a tilt angle, such that the adjacent magnetic north and south tracks are oriented as a spiral shape. A radial disk multipole magnet array 700 is shown with shading to indicate the north and the south polarity of the tracks of the magnetic field. The radial disk multipole magnet array 700 has a center axis 705 about which the radial disk multipole magnet array 700 may rotate. The radial disk multipole magnet array 700 is formed of north pole layers 710 and south pole layers 715. The north and south pole layers 710 and 715 spiral inward towards the center axis 705 (e.g., the radius $R_1$ of each layer relative to the center axis 705 is monotonically increasing (clockwise direction) or decreasing (counterclockwise direction)). In this sense, the magnetic layers of the radial disk multipole magnet array 700 wind around the center axis 705 such that the layers are monotonically disposed (e.g., located or positioned in an outward spiral) about the center axis 705 as a function of the radial angle α about the center axis 705. Put another way, the radial width-wise mid-point of each magnetic layer is distributed monotonically as a function of the radial angle α about the center axis 705. Each north layer 710 is adjacent to a respective south layer 715, such that the layers alternate as the radial distance from the center axis 705 increases. At magnetic discontinuity 720, the layers switch polarity, but continue to spiral within the radial disk multipole magnet array 700.

Figure 8A:
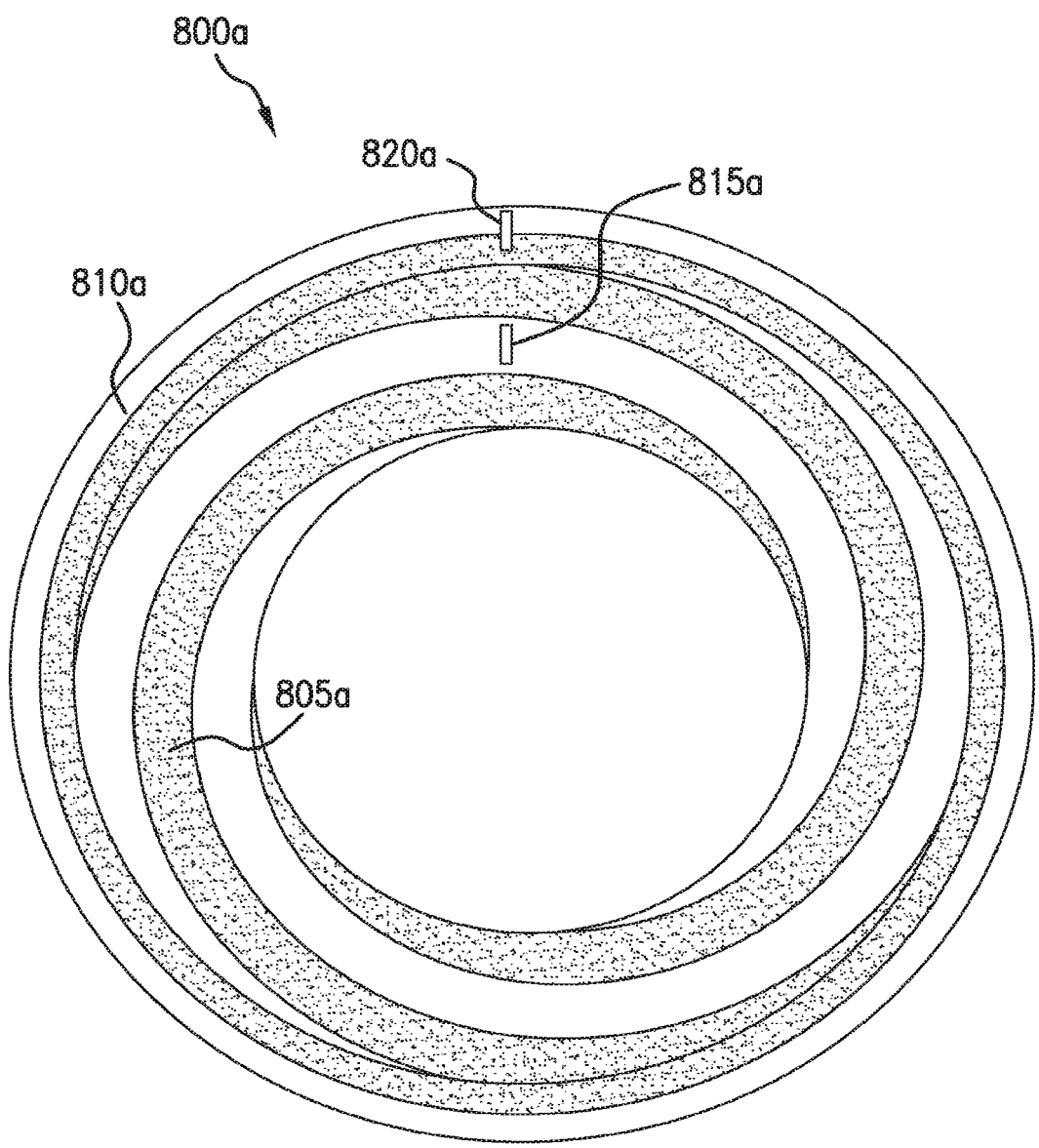
FIGS. 8A and 8B depict plan views of exemplary radial disk multipole magnet arrays with three adjacent magnetic north and south tracks having a tilt angle, such that the adjacent magnetic north and south tracks are oriented as a spiral shape, the radial disk also having outer concentric north and south poles in FIG. 8A, and inner concentric north and south poles in FIG. 8B, along with exemplary magnetic field sensors.
Figure 8B:
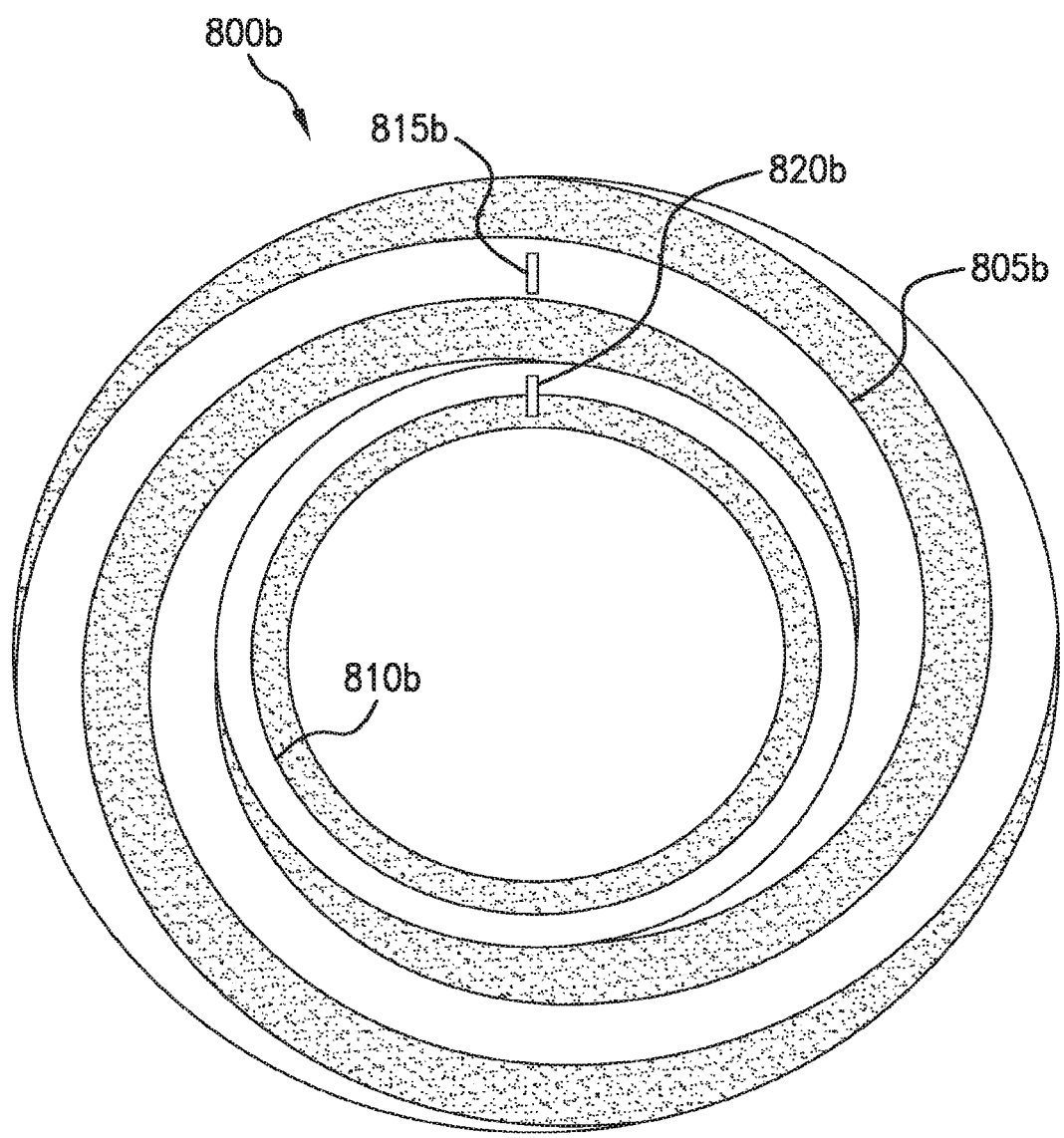

FIGS. 8A and 8B depict plan views of exemplary radial disk multipole magnet arrays with three adjacent magnetic north and south tracks having a tilt angle, such that the adjacent magnetic north and south tracks are oriented as a spiral shape, the radial disk also having outer concentric north and south poles in FIG. 8A, and inner concentric north and south poles in FIG. 8B, along with an exemplary magnetic field sensor. FIG. 8A depicts a first radial disk multipole magnet array 800a, which includes three adjacent tilted spiraled tracks in a spiraled magnetic layer section 805a. Circumscribing the spiraled magnetic layer section 805a are concentric north and south pole track sections 810a. In contrast with the spiraled magnetic layer section 805a, the concentric north and south pole layer section 810a does not have the form of spiral, but rather forms concentric circles on the outer perimeter of the first radial disk multipole magnet array 800a. These two concentric tracks may be used to monitor and compensate for measurement error due to the radial displacement induced by stack tolerances and ageing.

An angle magnetic field sensor 815a is located above a top surface of the spiraled magnetic layer section 805a. The angle magnetic field sensor 815a detects the variation of the magnetic field as the first disk radial multipole magnet array 800a rotates about its center axis. An off-axis misalignment magnetic field sensor 820a is located above a top surface of the concentric north and south pole layer section 810a. The off-axis misalignment magnetic field sensor 820a is used to detect and to compensate for the off-axis rotation/oscillation/movement of the first disk radial multipole magnet array 800a.

FIG. 8B depicts a second radial multipole magnet disk array 800b, which includes a spiraled magnetic layer section 805b. Within the spiraled magnetic layer section 805b is a concentric north and south pole layer section 810b. In contrast with the spiraled magnetic track sections 805b, the concentric north and south pole layer section 810b does not have the form of spiral, but rather forms concentric circles on the inner perimeter of the second disk radial multipole magnet array 800b.

An angle magnetic field sensor 815b is located above a top surface of, and in the middle of the spiraled magnetic layer section 805b, while an off-axis misalignment magnetic field sensor 820b is located above a top surface of the concentric north and south pole layer section 810b. These sensors 815b and 820b have a similar function to the sensors 815a and 820a discussed above (e.g., for correcting the output signal to compensate for the off-axis misalignment).

Figure 8C:
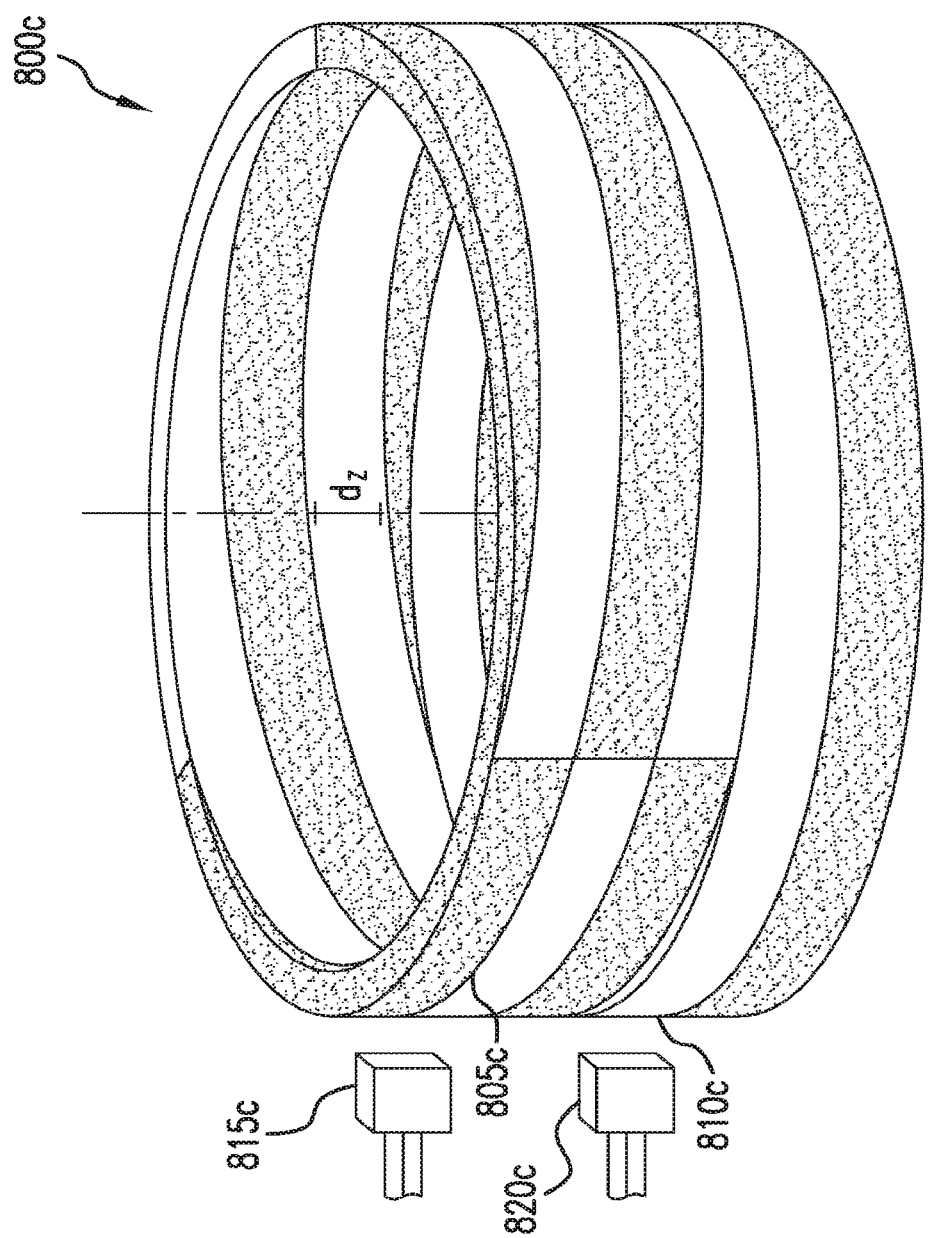
FIG. 8C depicts a perspective view of an exemplary axial cylindrical helical multipole magnet array along with an exemplary magnetic field sensor (similar to FIGS. 2 and 4A-C), the axial cylindrical helical multipole magnet array also having stacked north and south poles along with exemplary magnetic field sensors.

FIG. 8C depicts a perspective view of an exemplary axial cylindrical helical multipole magnet array along with an exemplary magnetic field sensor (similar to FIGS. 2 and 4A-C), the axial cylindrical helical multipole magnet array also having stacked north and south poles. An axial cylindrical helical multipole magnet array 800c includes a helical magnetic layer section 805c. Under the helical magnetic layer section 805c is a stacked north and south pole layer section 810*c*. In contrast with the helical magnetic layer section 805*c*, the stacked north and south pole layer section 810*c* does not have the form of helix, but rather forms stacked circles/cylinders on the bottom of the cylindrical helical multipole magnet array 800*c*.

An angle magnetic field sensor 815*c* is located adjacent to a side surface of the spiraled magnetic layer section 805*c* and in the middle of the three adjacent tracks, while an off-axis misalignment magnetic field sensor 820*c* is located adjacent to a side surface of the stacked north and south pole layer in the middle of the north and south tracks section 810*c*. These sensors 815*c* and 820*c* have a similar function to the sensors 815*a* and 820*a* discussed above (e.g., for correcting the output signal to compensate for the off-axis misalignment).

FIG. 8D depicts a perspective view of an exemplary planar multipole magnet array (similar to FIG. 5) along with an exemplary magnetic field sensor 815*d*, the planar multipole magnet array also having adjacent straight, non-angled magnetic track sections. A planar multipole magnet array 800*d* includes an angled magnetic layer section with three adjacent tilted magnetic tracks 805*d*. Above the angled magnetic layer section 805*d* is a straight magnetic layer section 810*d*. The straight magnetic layer section 810*d* includes two north and south track sections that run parallel to the length of the planar multipole magnet array 800*d*. In contrast, the angled magnetic layer section 805*d* has alternating north and south sections that run at an acute angle relative to the length of the planar multipole magnet array 800*d*.

An angle magnetic field sensor 815*d* is located above a top surface of the angled magnetic layer section 805*d* in the middle of the three tilted adjacent tracks, while a misalignment magnetic field sensor 820*d* is located adjacent to a top surface of the straight magnetic layer section 810*d*. These sensors 815*d* and 820*d* have a similar function to the sensors 815*a* and 820*a* discussed above. Specifically, the relative movement between the planar multipole magnet array 800*d* and the magnetic field sensor 815*d* and 820*d* may be misaligned due to stack tolerance or ageing, and this misalignment may be detected by the misalignment magnetic field sensor 820*d*.

For example, the magnetic field sensors 815*d* and 820*d* may be stationary, while the planar multipole magnet array 800*d* moves. If the movement of the planar multipole magnet array 800*d* is not parallel to the length of the planar multipole magnet array 800*d*, then this misaligned movement may be detected by the misalignment magnetic field sensor 820*d* (due to a changing magnetic field in the vicinity of the misalignment magnetic field sensor 820*d*). In the proper alignment however, there may be virtually no change in the magnetic field around the misalignment magnetic field sensor 820*d* because the misalignment magnetic field sensor 820*d* may be held at the same width-wise position along the straight magnetic layer section 810*d*. Therefore, a varying output of the misalignment magnetic field sensor 820*d* (due to misalignment of the planar multipole magnet array 800*d*) may be indicative of misalignment, while a constant output of the misalignment magnetic field sensor 820*d* (due to proper alignment of the planar multipole magnet array 800*d*) may be indicative of proper alignment and be used to correct the 815*d* signal output.

In some examples, if the cylindrical multipole magnet array is attached to a rotating shaft that has been damaged or worn, the rotating shaft may rotate about an axis that is not aligned with a center axis about which the shaft is configured to rotate. In this situation, the cylindrical multipole magnet array may exhibit off-axis misalignment motion (e.g., mutating motion). This off-axis motion can be measured by the off-axis misalignment magnetic field sensor that may output an electrical signal indicative of this off-axis motion. The measurements by the angle magnetic field sensor may then be corrected using the measurements of the off-axis misalignment magnetic field sensor. By taking into account any off-axis misalignment, the measurements taken by the off-axis misalignment magnetic field sensor may be combined with the measurements of the angle magnetic field sensor to provide for a more accurate measurement of the angular rotation of the cylindrical multipole magnet array.

In some examples, the tilt angle of the cylindrical radial multipole magnet array may be adjusted to create N periods per revolution of the ring magnet to replace resolvers for application where resolvers are typically used, like the control of N pole electrical motors.

FIG. 9 depicts plan views of exemplary radial disk multipole magnet arrays (similar to FIG. 7) with three adjacent magnetic north and south tracks having a tilt angle, the adjacent magnetic north and south tracks being oriented as a spiral shape and having varying degrees of spiraling. A single-pole radial disk multipole magnet array 900 depicts a spiral pattern corresponding to a "single pole" design. As shown, the single-pole radial disk multipole magnet array 900 has three adjacent magnetized tracks 900*a*, 900*b*, 900*c* having the same width w and some being tapered off into infinitesimal slices moving (counter) clockwise around the single-pole radial disk multipole magnet array 900. This "single pole" magnetic design pattern provides one periodic signal output per 360° rotation when associated with a magnetic sensing probe.

A two-pole radial disk multipole magnet array 905 depicts a spiral pattern corresponding to a "two poles" design. As shown, the two-pole radial disk multipole magnet array 905 has three adjacent magnetized tracks 900*a*, 900*b*, 900*c* having the same width w and being tapered off into infinitesimal slices moving (counter) clockwise around the two-pole radial disk multipole magnet array 905. This "two pole" magnetic design pattern provides two periodic signal output per 360° rotation when associated with a magnetic sensing probe.

A four-pole radial disk multipole magnet array 910 depicts a spiral pattern corresponding to a "four poles" design. As shown, the four-pole radial disk multipole magnet array 910 has four adjacent magnetized tracks 900*a*, 900*b*, 900*c*, 900*d* having the same width w and being tapered off into infinitesimal slices moving (counter) clockwise around the four-pole cylindrical radial multipole magnet array 910. This "four pole" magnetic design pattern provides three periodic signal output per 360° rotation when associated with a magnetic sensing probe.

For each of the radial disk multipole magnet array designs 900, 905, and 910, the tightness or tilted angle of the spiral (which determines the number of "poles") can be customized to create an N period sinusoidal signal per revolution of the radial disk multipole magnet array. More generally, in various embodiments the pitch or tilt angle of the radial disk multipole magnet array having an outer radius R may be specifically adjusted to create N periods per revolution of the radial disk multipole magnet array. The adjusted spiral pitch angle $\theta_N$ is to create N periods P of the sinusoidal electrical signal per revolution of 360 degree of the radial disk multipole magnet array having at least three adjacent poles with a constant pole width w. The angle $\theta_N$ that will generate N periods P is given by the equation:

$$\tan(\theta_N) = \frac{Nw}{2\pi R}$$

A radial disk multipole magnet array may be configured to replace resolvers for control of N pole electrical motors. For example, an electrical motor with four poles (N=4) may use a four-pole cylindrical radial multipole magnet array to create 4 periods per revolution. In another example, an electrical motor with sixteen poles (N=16) may use a sixteen-pole cylindrical radial multipole magnet array to create 16 periods per revolution. In this sense, the number of poles of the cylindrical radial multipole magnet array may be advantageously tailored to a specific type of electrical motor having a specific number of poles.

In some examples, two additional concentric north and south tracks may be located on the inner and/or outer diameter of an axial (or radial) magnetized ring. An additional magnetic field sensor may be located in the middle of the two additional tracks in order to measure any off-axis misalignment resulting from aging or stack tolerances. The measurement of this additional magnetic field sensor may be used to correct the output of the sensor signal accordingly (e.g., to account for the off-axis misalignment). In some examples, the addition of two non-tilted north and south tracks may also be applied in the case of the "axial design" (see, e.g., FIG. 1 and FIG. 8C) and "planar design" (see, e.g., FIG. 8D).

Figure 10:
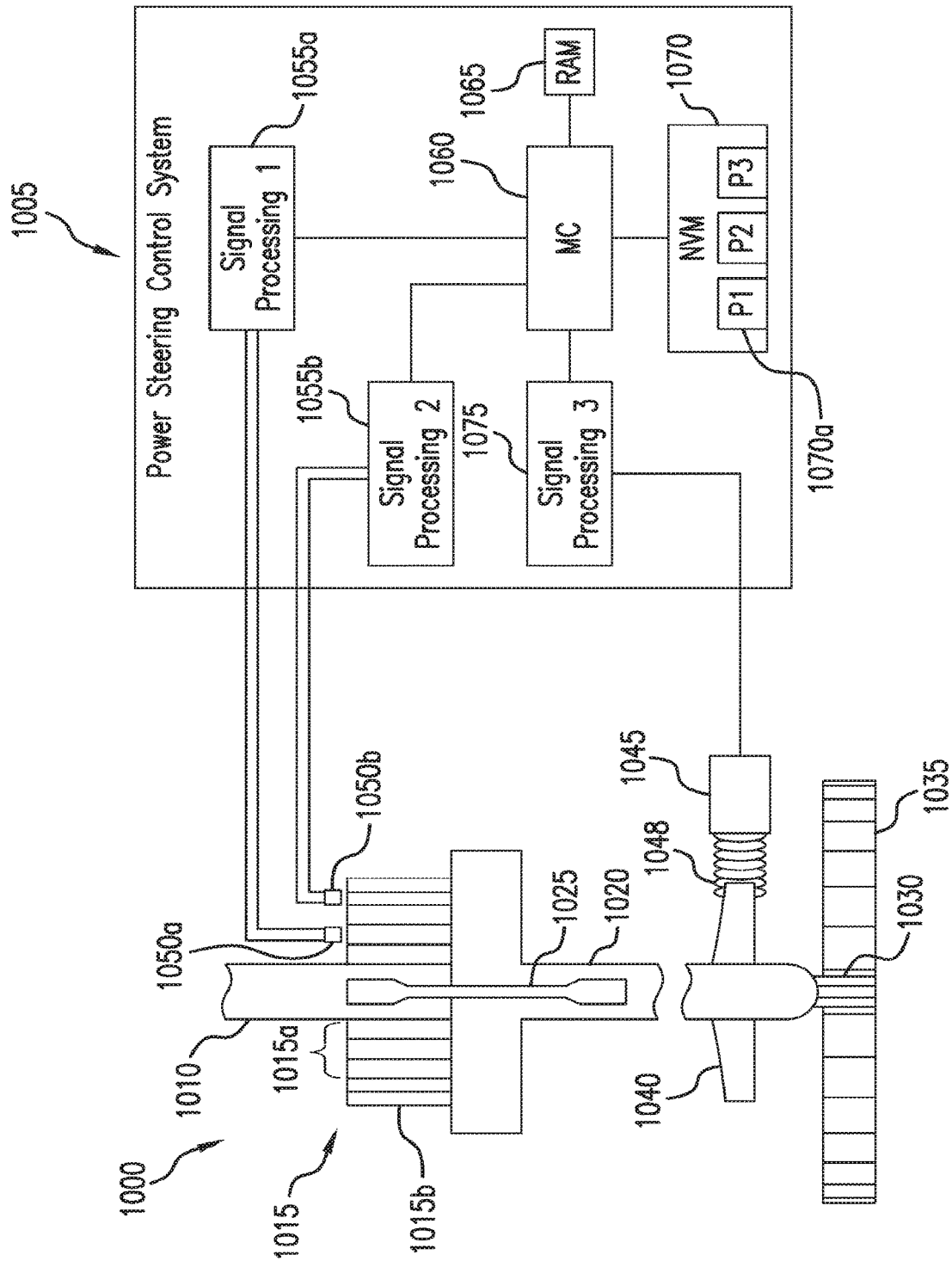
FIG. 10 depicts a cross sectional view of an exemplary power control steering system along with a block diagram of an exemplary power steering monitoring and control system.

FIG. 10 depicts a cross sectional view of an exemplary power control steering system along with a block diagram of an exemplary power steering monitoring and control system. A mechanical system 1000 is used, for example, for controlling the steering of the wheels in an automobile. The mechanical system 1000 is connected to a power steering monitoring and control system 1005.

The mechanical system 1000 includes a steering column 1010. The steering column 1010 may be operably coupled, for example, to a steering wheel of an automobile (not shown). Fixedly coupled to the steering column 1010 is a cylindrical radial multipole magnet array 1015 similar in construction to the first cylindrical radial multipole magnet array 800a in FIG. 8A (e.g., it includes a spiraled magnetic layer section 1015a (corresponding to 805a) and a concentric north and south pole layer section 1015b (corresponding to 810a)). In some examples, when a user turns the steering wheel of the automobile, this turning may impart rotational motion on the steering column 1010, which also results in rotation of the cylindrical radial multipole magnet array 1015.

Also included in the mechanical system 1000 is a steering shaft 1020. The steering column 1010 and the steering shaft 1020 are operably coupled to one another via a torsion bar 1025. The steering shaft 1020 has a pinion gear 1030 at a distal end. The pinion gear 1030 is configured to drive a rack 1035 connected to the wheels (not shown) of the automobile. The steering shaft 1020 includes a worm wheel 1040. The worm wheel 1040 is driven by a motor 1045 having a worm 1048.

The rotation of the cylindrical radial multipole magnet array 1015 is measured by an angle magnetic field sensor 1050a via detection of the changing magnetic field caused by rotation of the spiraled magnetic layer section 1015a. An off-axis misalignment magnetic field sensor 1050b measures the magnetic field created by the concentric north and south pole layer section 1015b. If, for example, there is no axial misalignment of the cylindrical radial multipole magnet array 1015, then the output signal of the off-axis misalignment magnetic field sensor 1050b would not vary (e.g., it would be constant) as the cylindrical radial multipole magnet array 1015 rotates. If, however, there is axial misalignment of the cylindrical radial multipole magnet array 1015, then the output signal of the off-axis misalignment magnetic field sensor 1050b would vary as the cylindrical radial multipole magnet array 1015 rotates. This varying output signal is used to correct any artifacts in the output signal of the angle magnetic field sensor 1050a caused by axial misalignment.

With respect to the power steering monitoring and control system 1005, the output signals from the magnetic field sensors 1050a and 1050b are transmitted to a first signal processing module 1055a and a second signal processing module 1055b, respectively. The signal processing modules 1055a and 1055b perform various signal processing functions on the respective output signals from the magnetic field sensors 1050a and 1050b. For example, the signal processing modules 1055a and 155b may perform stochastic filtering, sampling, digital signal processing, statistical operations, spectral analysis, time-frequency/series analysis, thresholding, digital to analog (D/A) conversion, analog to digital (D/A) conversion, and/or data transformation. In some embodiments, the signal processing modules 1055a and 155b may convert analog signals received from their respective magnetic field sensors 1050a and 1050b into digital signals.

The output signals from the magnetic field sensors 1050a and 1050b, after being respectively processed by signal processing modules 1055a and 1055b, are forwarded to a microcontroller 1060. The microcontroller 1060 is coupled to random-access memory (RAM) 1065. The microcontroller 1060 is also coupled to non-volatile memory (NVM) 1070, which contains program instructions that when executed by the microcontroller 1060, cause the microcontroller to perform various program functions. For example, the NVM 1070 may include program instructions for an off-axis compensation algorithm 1070a. The off-axis compensation algorithm 1070a may take as inputs the processed signals from the signal processing modules 1055a and 1055b, and correct for any off-axis misalignment of the cylindrical radial multipole magnet array 1015. For example, the off-axis compensation algorithm 1070a may cause the microcontroller 1060 to subtract the output signal of the off-axis misalignment magnetic field sensor 1050b from the output signal of the angle magnetic field sensor 1050a to generate a corrected rotation signal (that accounts for any axial misalignment). The corrected rotation signal may then be used by the microcontroller 1060 to control the motor 1045.

Coupled to the microcontroller 1060 is a third signal processing module 1075 that performs various signal processing functions similar to the signal processing modules 1055a and 155b. The motor 1045 is coupled to the third signal processing module 1075, so that the motor 1045 receives command instructions from the microcontroller 1060.

In an illustrative example, a corrected rotation signal calculated by the microcontroller 1060 may be forwarded to the third signal processing module 1075, which may convert the corrected rotation signal from digital to an analog signal. This analog signal may then be supplied to the motor 1045 to control various operating parameters of the motor 1045. For example, a sinusoidal input signal from the angle magnetic field sensor 1050a (as the result of a user continuously turning a steering wheel clockwise and counterclockwise) may be translated into a sinusoidal control output signal to the motor 1045. This sinusoidal control output signal may cause the worm 1048 to rotate clockwise and counterclockwise in a sinusoidal fashion, thus translating into the wheels connected to the rack 1035 oscillating between turning right and turning left. It is in this sense that a vehicle's power steering system functions using the mechanical system 1000 and the power steering monitoring and control system 1005.

Although various embodiments have been described with reference to the Figures, other embodiments are possible. For example, a cylindrical magnet array may have the shape of a hollow cylinder. A hollow cylinder design may permit the cylindrical magnet array to be attached to a shaft. In some embodiments, a cylindrical magnet array may have the shape of a closed cylinder. A closed cylinder design may advantageously allow for more magnetic layers in the cylindrical magnet array.

In various embodiments, the magnetic field sensor/magnetic field probe may not be limited to a specific type of magnetic field sensor. For example, the magnetic field sensor may be any of the following types of magnetic field sensors: Hall effect sensor, magneto-diode, magneto-transistor, AMR magnetometer, GMR magnetometer, magnetic tunnel junction magnetometer, magneto-optical sensor, Lorentz force based MEMS sensor, Electron Tunneling based MEMS sensor, MEMS compass, Nuclear precession magnetic field sensor, optically pumped magnetic field sensor, fluxgate magnetometer, search coil magnetic field sensor, magneto-resistive sensor, TMR sensor, or SQUID magnetometer. In some examples, where more than one magnetic field sensor is deployed, they may be of different types. For example, if two magnetic field sensors are used to detect movement of a magnetic array, one sensor may be a AMR magnetometer, while the other may be a Hall effect sensor.

In some examples, the magnetic field sensor may include two interleaved or overlaid magneto-resistive (MR) Wheatstone bridge sensors. The two MR bridge sensors may be offset by 45 degrees with respect to one another. Measuring the differential signals of these two MR bridge sensors (via comparators or operational amplifiers) may advantageously produce separate sine and cosine signals (e.g., signals phase shifted by 90 degrees). The periodic sine and cosine signal output generated by the two MR bridges tilted 45 degrees with respect to one another may be the result of relative movement of the MR bridges above a multipole magnetic array (e.g., a linear track or multipoles ring magnet). These sine and cosine signals may allow for extraction of the angle, speed, direction, and linear position of the multipole magnetic array (e.g., using an arctangent function to extract location information). In some examples, displacement in the x-direction of a magnetic field sensor above a multipoles magnetic array may generates a periodic sine signal output with one period per pole length p. The airgap between a multipole magnet array and the magnetic field sensor may be between p/2 and p/4, to minimize the sine signal distortion. For example, the two MR bridges may have a periodic output defined by $Y_1 = \cos(2\pi X/P)$ and $Y_2 = \sin(2\pi X/P)$, respectively.

In some embodiments, linear displacement of a magnetic field sensor with respect to a multipole magnet array tilted at an angle θ may generate a sine signal with a period P that may depend on the value of θ. Accordingly, two MR bridges may generate sine and cosine signals by using a periodic multipole magnetic array having pole width of w with a signal period of:

$$P = \frac{w}{\cos\theta}$$

by introducing an angle θ between the displacement of the magnetic field sensor and the direction of the adjacent magnetic poles. This may be done while keeping the air gap between the magnetic field sensor and the multipole magnetic track between w/2 and w/4, in order to minimize the sine signal distortion. In various embodiments, the magnetic field sensor may be stationary, while multipole magnet array may be in motion. The magnetic field sensor may instead be in motion, while multipole magnet array may be stationary.

In various examples, the magnetic field sensor may be an anisotropic magnetoresistance (a magnetic field) sensor. Such sensors may be sensitive to a magnetic field that is parallel to the plane in which the magnetic field sensor lies. Such sensors may detect the angle of the magnetic field, but may not discriminate the field polarity.

The embodiments shown in FIGS. 1, 2, 4A-C, 6A, and 8C may be referred to as an "axial design," "cylindrical design," or "helical design" for a multipole magnet array. The embodiments shown in FIGS. 6B, 7, 8A-B, 9, and 10 may be referred to as an "radial design," "disk design," or "spiral design" for a multipole magnet array. The axial and radial designs may advantageously mount to a rotating shaft of a motor, for example. The embodiments shown in FIGS. 3, 5A-C, and 8D may be referred to as an "planar design" for a multipole magnet array. The planar design may advantageously be integrated into a flat track located on an assembly line, for monitoring the speed at which the assembly line is moving.

Some embodiments may include a device suitable as a replacement for a resolver to detect a position of a rotating shaft. In some embodiments, a cylindrical magnet may have a center axis of rotational symmetry and individually magnetized layers, each layer of the individually magnetized layers being adjacent to at least one oppositely magnetized layer. The individually magnetized layers may wind around the center axis of rotational symmetry such that each layer of the individually magnetized layers is monotonically disposed with respect to the center axis of rotational symmetry as a function of a radial angle α about the center axis of rotational symmetry.

In various examples, at least one magnetic field sensor may be configurable to detect a changing magnetic field in response to a relative motion between the cylindrical magnet and the at least one magnetic field sensor. The at least one magnetic field sensor may be configurable to output a motion signal indicative of the relative motion between the cylindrical magnet and the at least one magnetic field sensor. The at least one magnetic field sensor may include two MR bridges rotated 45 degrees with respect to one another and disposed proximate to the cylindrical magnet, such that one MR bridge of the two MR bridges produces a sine signal and the other MR bridge of the two MR bridges produces a cosine signal when the cylindrical magnet rotates at a constant angular velocity relative to the magnetic field sensor.

In some examples, when the cylindrical magnet rotates about the center axis of rotational symmetry, the movement of consecutive individually magnetized layers may be at a translation angle θ greater than zero degrees and less than 90 degrees relative to the at least one magnetic field sensor. Each layer in the individually magnetized layers may have a width of p, such that the sine and cosine signals may have a period of P=p/cos(θ) per revolution of the cylindrical magnet.

In some embodiments, the at least one magnetic field sensor may be disposed radially from a center of the magnet and the center axis of rotational symmetry, such that the at least one magnetic field sensor is disposed proximate to an outer perimeter of the cylindrical magnet. In various examples, the at least one magnetic field sensor may be disposed radially and axially from a center of the cylindrical magnet and the center axis of rotational symmetry, such that the at least one magnetic field sensor is disposed proximate to a top surface of the cylindrical magnet.

In some examples, the individually magnetized layers may be oriented in a radial spiral relative to the center axis of rotational symmetry, such that each layer in the individually magnetized layers is disposed at a radial distance from the center axis of rotational symmetry that increases as a function of increasing radial angle α about the center axis of rotational symmetry. A top surface of the disk magnet may have magnetic field lines that are substantially concentric to the center axis of rotational symmetry. Some examples may include concentric north and south disk magnets integrated with the disk magnet.

In various embodiments, the individually magnetized layers may be oriented in a helix having a helical axis aligned with the center axis of rotational symmetry, such that each layer in the individually magnetized layers progressively coils around the helical axis as an increasing function of axial displacement $d_z$ along the helical axis. An outer surface of the disk magnet may have magnetic field lines that are substantially orthogonal to the center axis of rotational symmetry.

A position measurement system for measuring the position of a movable device versus a fixed device may include a two-dimensional (2D) surface magnet array with adjacent magnetized tracks having sequentially alternating magnetic polarities, each magnetized track having a constant width w. The position measurement system for measuring the position of a movable device versus a fixed device may include at least one magnetic field sensor located proximate to, and maintaining a constant airgap with respect to, the 2D surface magnet array. In some examples, the 2D surface magnet array and the at least one magnetic field sensor may be in a specific relative orientation such that a relative trajectory of the at least one magnetic field sensor is configured to be at a tilted, acute angle θ with respect to a length direction of the at least three adjacent magnetized tracks of the 2D surface magnet array. In response to relative movement along the relative trajectory, the at least one magnetic field sensor may be configured to generate a periodic position signal having a period $P_θ$ that depends, at least in part, upon the width w and the tilted, acute angle θ. In various examples, the 2D surface magnet array may have two or more adjacent magnetized tracts. In some embodiments, the at least one magnetic field sensor may be able to sense the magnetic field generated by at least two (or at least three) adjacent magnetized tracks. In various examples, a 2D surface magnet array may have two or more magnetized strips that result in three or more magnetized tracks.

In some embodiments, in response to relative movement along the relative trajectory, the at least one magnetic field sensor may be configured to generate a periodic position signal having a period $P_θ$ that depends, at least in part, upon the width w and the tilted, acute angle θ according to the equation:

$$P_θ = a \frac{w}{\cos θ},$$

with a=1 or a=2,

Where a=1 covers the case where the magnetic field sensor (e.g., magnetic probe) outputs one period per pole (e.g., a single north or south pole), and a=2 covers the case where the magnetic field sensor outputs and one period per pole pair (e.g., a pair of poles including a north and a south pole). Depending on the type of magnetic field sensor being used, the magnetic field sensor may output one period per north or south pole, or one period per north/south pole pair. For example, a magneto-resistive magnetic probe may output one period per north or south pole (meaning one period for crossing over a north pole, then another period for crossing over a south pole). In some examples, a Hall-Effect magnetic probe may output one period per pole pair (meaning one period for crossing over a combined north/south pole pair. The different periodic outputs may be the result of the specific properties of a given magnetic field sensor. For example, a TMR or Hall-Effect sensor may be able to differentiate between north and south poles and may produce a single period as it crosses over a north/south pole pair, while an AMR sensor may provide two periods as it crosses over a north/south pole pair (e.g., one period crossing over the north pole, then another period crossing over the south pole).

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments may be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random-access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. An exemplary embodiment may be implemented in a computer system that includes a graphical user interface and/or an Internet browser. To provide for interaction with a user, some implementations may be implemented on a computer having a display device, such as an LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from a source to a receiver over a dedicated physical link (e.g., fiber optic link, infrared link, ultrasonic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, FireWire, ATA/IDE, RS-232, RS-422, RS-485, 802.11 a/b/g/n, Wi-Fi, WiFi-Direct, Li-Fi, BlueTooth, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

In various embodiments, a computer system may include non-transitory memory. The memory may be connected to the one or more processors may be configured for encoding data and computer readable instructions, including processor executable program instructions. The data and computer readable instructions may be accessible to the one or more processors. The processor executable program instructions, when executed by the one or more processors, may cause the one or more processors to perform various operations.

In various embodiments, the computer system may include Internet of Things (IoT) devices. IoT devices may include objects embedded with electronics, software, sensors, actuators, and network connectivity which enable these objects to collect and exchange data. IoT devices may be in-use with wired or wireless devices by sending data through an interface to another device. IoT devices may collect useful data and then autonomously flow the data between other devices.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A position measurement system for measuring the position of a movable device versus a fixed device, the position measurement system comprising:
    a two-dimensional (2D) surface magnet array with at least three adjacent magnetized tracks having sequentially alternating magnetic polarities, each magnetized track having a constant width w; and
    at least one magnetic field sensor disposed proximate to, and maintaining a constant airgap with respect to, the 2D surface magnet array, wherein an airgap distance between the at least one magnetic field sensor and the 2D surface magnet array is between w/2 and w/4 to minimize signal distortion,
    wherein the 2D surface magnet array and the at least one magnetic field sensor are in a specific relative orientation such that a relative trajectory of the at least one magnetic field sensor is configured to be at a tilted, acute angle θ with respect to a length direction of the at least three adjacent magnetized tracks of the 2D surface magnet array,
    wherein in response to relative movement along the relative trajectory, the at least one magnetic field sensor is configured to generate a periodic position signal having a period $P_\theta$ that depends, at least in part, upon the width w and the tilted, acute angle θ according to the equation:

$$P_\theta = a \frac{w}{\cos\theta},$$

with a=1 or a=2.

2. The position measurement system of claim 1, wherein the relative trajectory comprises the 2D surface magnet array rotating relative to the at least one magnetic field sensor.

3. The position measurement system of claim 2, wherein the 2D surface magnet array is a radial disk spiral multipole magnet array having an outer radius R.

4. The position measurement system of claim 3, wherein the tilted, acute angle θ is set so that the at least one magnetic field sensor is configured to generate N periods of the periodic position signal per 360° revolution of the radial disk spiral multipole magnet array based on the formula:

$$\tan(\theta_N) = \frac{Nw}{2\pi R}.$$

5. The position measurement system of claim 3:
wherein the 2D surface magnet array further comprises:
    circular concentric north and south magnetized tracks having a common central axis with the radial disk spiral multipole magnet array, and,
wherein the at least one magnetic field sensor comprises:
    a position magnetic field sensor disposed above a top surface of the radial disk spiral multipole magnet array; and,
    a radial misalignment magnetic field sensor disposed above a top surface of the circular concentric north and south magnetized tracks.

6. The position measurement system of claim 3, further comprising a bearing having an inner race and an outer race, wherein the 2D surface magnet array is fixedly coupled to one of the inner race and outer race, and the at least one magnetic field sensor is fixedly coupled to the other of the inner race and outer race.

7. The position measurement system of claim 2, wherein the 2D surface magnet array comprises an axial cylindrical helical multipole magnet array having an outer radius R.

8. The position measurement system of claim 7, wherein the tilted, acute angle θ is set so that the at least one magnetic field sensor is configured to generate N periods of the periodic position signal per 360° revolution of the axial cylindrical helical multipole magnet array based on the formula:

$$\tan(\theta_N) = \frac{Nw}{2\pi R}.$$

9. The position measurement system of claim 7, further comprising a bearing having an inner race and an outer race, wherein the 2D surface magnet array is fixedly coupled to one of the inner race and outer race, and the at least one magnetic field sensor is fixedly coupled to the other of the inner race and outer race.

10. The position measurement system of claim 7:
wherein the 2D surface magnet array further comprises:
    circular stacked north and south magnetized tracks having a common central axis with the axial cylindrical helical multipole magnet array, and,
wherein the at least one magnetic field sensor comprises:
    a position magnetic field sensor disposed above a side surface of the axial cylindrical helical multipole magnet array; and,
    an axial misalignment magnetic field sensor disposed above a side surface of the circular stacked north and south magnetized tracks.

11. The position measurement system of claim 1, wherein the relative trajectory comprises the 2D surface magnet array translating relative to the at least one magnetic field sensor.

12. The position measurement system of claim 11, wherein the 2D surface magnet array comprises a planar multipole magnet array having a length L.

13. The position measurement system of claim 12, wherein the tilted, acute angle θ is set so that the at least one magnetic field sensor is configured to generate N periods of the periodic position signal per displacement over the length L of the 2D surface magnet array based on the formula:

$$\tan(\theta_N) = \frac{Nw}{L}.$$

14. The position measurement system of claim 12:
wherein the 2D surface magnet array further comprises:
    straight stacked north and south magnetized tracks that run parallel to the length L of the 2D surface magnet array and are disposed above the planar multipole magnet array, and,
wherein the at least one magnetic field sensor comprises:
    an angle magnetic field sensor disposed above a top surface of the planar multipole magnet array; and,
    an off-axis misalignment magnetic field sensor disposed above a top surface of the circular concentric north and south magnetized tracks.

15. The position measurement system of claim 1, wherein the at least one magnetic field sensor is configured to output at least one periodic sine signal in response to relative movement along the relative trajectory.

16. The position measurement system of claim 1, further comprising the movable device and the fixed device, the movable device having a predetermined trajectory relative to the fixed device with a constant airgap between the fixed and movable devices, wherein the at least one magnetic field sensor is fixedly coupled to one of the fixed device and the movable device, and the 2D surface magnet array is fixedly coupled to the other of the fixed device and the movable device.

17. A position measurement system for measuring the position of a movable device versus a fixed device, the position measurement system comprising:
    a two-dimensional (2D) surface magnet array with at least three adjacent magnetized tracks having sequentially alternating magnetic polarities, each magnetized track having a constant width w; and
    at least one magnetic field sensor disposed proximate to, and maintaining a constant airgap with respect to, the 2D surface magnet array,
    wherein the 2D surface magnet array and the at least one magnetic field sensor are in a specific relative orientation such that a relative trajectory of the at least one magnetic field sensor is configured to be at a tilted, acute angle θ with respect to a length direction of the at least three adjacent magnetized tracks of the 2D surface magnet array,
    wherein the at least one magnetic field sensor is configured to output at least one periodic sine signal and at least one periodic cosine signal in response to relative movement along the relative trajectory, such that the at least one magnetic field sensor allows for an absolute position measurement of the 2D surface magnet array relative to the at least one magnetic field sensor within the period of the sine and the cosine signal,
    wherein in response to relative movement along the relative trajectory, the at least one magnetic field sensor is configured to generate a periodic position signal having a period Pe that depends, at least in part, upon the width w and the tilted, acute angle θ according to the equation:

$$P_\theta = a\frac{w}{\cos\theta},$$

with a=1 or a=2.

18. A position measurement system for measuring the position of a movable device versus a fixed device, the position measurement system comprising:
- a two-dimensional (2D) surface magnet array with at least three adjacent magnetized tracks having sequentially alternating magnetic polarities, each magnetized track having a constant width w; and
- at least one magnetic field sensor disposed proximate to, and maintaining a constant airgap with respect to, the 2D surface magnet array, wherein the at least one magnetic field sensor comprises two magneto-resistive (MR) Wheatstone bridge sensors tilted by 45° with respect to one another that are located separate one from the other or that are interlaced one within the other,
- wherein the 2D surface magnet array and the at least one magnetic field sensor are in a specific relative orientation such that a relative trajectory of the at least one magnetic field sensor is configured to be at a tilted, acute angle θ with respect to a length direction of the at least three adjacent magnetized tracks of the 2D surface magnet array,
- wherein in response to movement along the relative trajectory, a first MR Wheatstone bridge sensor in the two MR Wheatstone bridge sensors is configured to output a sine signal, a second MR Wheatstone bridge sensor in the two MR Wheatstone bridge sensors is configured to output a cosine signal, such that the two MR Wheatstone bridge sensors allow for an absolute position measurement of the 2D surface magnet array relative to the at least one magnetic field sensor within the period of the sine and the cosine signal,
- wherein in response to relative movement along the relative trajectory, the at least one magnetic field sensor is configured to generate a periodic position signal having a period $P_\theta$ that depends, at least in part, upon the width w and the tilted, acute angle θ according to the equation:

$$P_\theta = a \frac{w}{\cos\theta},$$

with a=1 or a=2.

* * * * *